(12) United States Patent
Yoon et al.

(10) Patent No.: US 12,501,673 B2
(45) Date of Patent: Dec. 16, 2025

(54) SEMICONDUCTOR DEVICES HAVING DIFFERENT IMPURITY REGIONS IN ACTIVE PATTERN

(71) Applicant: SAMSUNG ELECTRONICS CO., LTD., Suwon-si (KR)

(72) Inventors: Seokhyeon Yoon, Suwon-si (KR); Taehyeon Kim, Suwon-si (KR); Seunghun Lee, Suwon-si (KR); Hyeongrae Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 338 days.

(21) Appl. No.: 18/196,081

(22) Filed: May 11, 2023

(65) Prior Publication Data
US 2024/0006485 A1   Jan. 4, 2024

(30) Foreign Application Priority Data
Jul. 4, 2022  (KR) .................. 10-2022-0081692

(51) Int. Cl.
| | | |
|---|---|---|
| H10D 62/10 | (2025.01) | |
| H10D 30/43 | (2025.01) | |
| H10D 30/67 | (2025.01) | |
| H10D 64/01 | (2025.01) | |

(52) U.S. Cl.
CPC .......... *H10D 62/121* (2025.01); *H10D 30/43* (2025.01); *H10D 30/6735* (2025.01); *H10D 30/6757* (2025.01); *H10D 64/017* (2025.01)

(58) Field of Classification Search
CPC .. H10D 62/121; H10D 30/6757; H10D 30/43; H10D 64/017
See application file for complete search history.

(56) References Cited

U.S. PATENT DOCUMENTS

| | | | |
|---|---|---|---|
| 8,642,436 | B2 | 2/2014 | Ooi et al. |
| 9,006,065 | B2 | 4/2015 | Yen et al. |
| 9,515,136 | B2 | 12/2016 | Fragapane |
| 9,806,154 | B2 | 10/2017 | Tsai et al. |
| 9,837,320 | B2 | 12/2017 | Pritiskutch et al. |
| 9,859,380 | B2 | 1/2018 | Lee et al. |
| 10,403,752 | B2 | 9/2019 | Jambunathan et al. |
| 10,516,022 | B2 | 12/2019 | Bartolf et al. |
| 11,024,502 | B2 | 6/2021 | Konrath et al. |
| 11,164,746 | B2 | 11/2021 | Chen et al. |
| 2016/0064429 | A1 | 3/2016 | Iida et al. |
| 2020/0373163 | A1 | 11/2020 | Ortner et al. |

*Primary Examiner* — Timor Karimy
(74) *Attorney, Agent, or Firm* — Sughrue Mion, PLLC

(57) ABSTRACT

A semiconductor device include first and second active patterns, first and second gate structures, and first and second source/drain layers. The first and second active patterns extend on the first and second regions in a first direction. The first and second gate structures are formed on the first and second active patterns, and extend in a second direction. The first and second source/drain layers are formed on the first and second active patterns adjacent to the first and second gate structures. The first active pattern includes a first well having first and second impurity regions. The second active pattern includes a second well having third and fourth impurity regions. A width in the second direction of the first impurity region is greater than that of the second impurity region. A width in the second direction of the third impurity region is smaller than that of the fourth impurity region.

20 Claims, 32 Drawing Sheets

SEMICONDUCTOR DEVICES HAVING DIFFERENT IMPURITY REGIONS IN ACTIVE PATTERN

CROSS-REFERENCE TO RELATED APPLICATION

This application claims priority to Korean Patent Application No. 10-2022-0081692, filed on Jul. 4, 2022 in the Korean Intellectual Property Office, the disclosure of which is incorporated herein in its entirety by reference.

BACKGROUND

1. Field

Example embodiments relate to a semiconductor device in which different impurity regions are formed in an active pattern.

2. Descriptions of Related Art

An impurity region is formed by an ion implantation process on an active pattern on which a transistor is formed. The ion implantation process is performed using an ion implantation mask having an opening that exposes an area in which the impurity region is formed. If a plurality of impurity regions having different positions and areas are to be formed, a plurality of ion implantation masks may need to be formed, and if misalignment occurs during the formation of the plurality of ion implantation masks, the impurity regions may not be formed at desired positions with desired areas.

SUMMARY

Example embodiments provide a semiconductor device having an improved device performance.

According to example embodiments, there is provided a semiconductor device. The semiconductor device may include: first and second active patterns, first and second gate structures, and first and second source/drain layers on a substrate including first and second regions. The first and second active patterns may extend on the first and second regions, respectively, of the substrate in a first direction substantially parallel to an upper surface of the substrate. The first and second gate structures may be formed on the first and second active patterns, respectively, and may extend in a second direction substantially parallel to the upper surface of the substrate and crossing the first direction. The first and second source/drain layers may be formed on portions of the first and second active patterns, respectively, adjacent to the first and second gate structures, respectively. The first active pattern may include a first well having first and second impurity regions stacked in a third direction substantially perpendicular to the upper surface of the substrate. The second active pattern may include a second well having third and fourth impurity regions stacked in the third direction. A width in the second direction of the first impurity region may be greater than a width in the second direction of the second impurity region. A width in the second direction of the third impurity region may be smaller than a width in the second direction of the fourth impurity region.

According to example embodiments, there is provided a semiconductor device. The semiconductor device may include an active pattern, a gate structure, channels and a source/drain layer on a substrate. The active pattern may extend in a first direction substantially parallel to an upper surface of the substrate. The gate structure may extend in a second direction substantially parallel to the upper surface of the substrate and crossing the first direction. The channels may be spaced apart from each other in a third direction substantially perpendicular to the upper surface of the substrate, and each of the channels may extend in the first direction through the gate structure. The source/drain layer may be formed on a portion of the active pattern adjacent to the gate structure. The substrate and the active pattern may include a well having first, second and third impurity regions stacked in the third direction. A maximum width in the second direction of the first impurity region may be greater than a width in the second direction of the active pattern. A width in the second direction of the second impurity region may be substantially equal to the width in the second direction of the active pattern. A width in the second direction of the third impurity region may be smaller than the width in the second direction of the active pattern.

According to example embodiments, there is provided a semiconductor device. The semiconductor device may include an active pattern, a gate structure, channels and a source/drain layer on a substrate. The active pattern may extend in a first direction substantially parallel to an upper surface of the substrate. The gate structure may extend in a second direction substantially parallel to the upper surface of the substrate and crossing the first direction. The channels may be spaced apart from each other in a third direction substantially perpendicular to the upper surface of the substrate, and each of the channels may extend in the first direction through the gate structure. The source/drain layer may be formed on a portion of the active pattern adjacent to the gate structure. The substrate and the active pattern may include a well having first, second and third impurity regions stacked in the third direction. A width in the second direction of each of the first and second impurity region may be smaller than a width in the second direction of the active pattern. A width in the second direction of the third impurity region may be substantially equal to the width in the second direction of the active pattern.

In the method of manufacturing the semiconductor device in accordance with example embodiments, the wells may be formed to have desired widths at desired depths in the substrate. Thus, in the semiconductor device, a punch-through phenomenon of an n-type metal-oxide-semiconductor field-effect transistor (NMOS) may decrease, and the a leakage current from a p-type metal-oxide-semiconductor field-effect transistor (PMOS) to the NMOS may decrease.

BRIEF DESCRIPTION OF DRAWINGS

FIGS. 1 to 4 are a plan view and cross-sectional views illustrating a semiconductor device, wherein FIG. 1 is a plan view, FIG. 2 is a cross-sectional view taken along line A-A' of FIG. 1, FIG. 3 includes cross-sectional views taken along lines B-B' and C-C', respectively, of FIG. 1, and FIG. 4 is a cross-sectional view taken along line D-D' of FIG. 1, in accordance with example embodiments.

FIGS. 5 to 32 are plan views and cross-sectional views illustrating a method of manufacturing a semiconductor device, wherein FIGS. 6-7, 9-11, 13, 15 and 31 are cross-sectional views taken along lines A-A' of corresponding plan views, respectively, FIGS. 16, 18, 21, 24, 26, 28 and 32 include cross-sectional views taken along lines B-B' and C-C' of corresponding plan views, respectively, and FIGS. 19, 22, 25 and 29 are cross-sectional views taken along lines D-D' of corresponding plan views, respectively, in accordance with example embodiments.

DETAILED DESCRIPTION

The embodiments described herein are example embodiments, and thus, the disclosure is not limited thereto and may be realized in various other forms.

It will be understood that, although the terms first, second, third, fourth, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the disclosure.

It will be understood that when an element or layer is referred to as being "over," "above," "on," "below," "under," "beneath," "connected to" or "coupled to" another element or layer, it can be directly over, above, on, below, under, beneath, connected or coupled to the other element or layer or intervening elements or layers may be present. In contrast, when an element is referred to as being "directly over," "directly above," "directly on," "directly below," "directly under," "directly beneath," "directly connected to" or "directly coupled to" another element or layer, there are no intervening elements or layers present.

Example embodiments will be described in detail with reference to the accompanying drawings. Hereinafter, in the specification (and not necessarily in the claims), two directions substantially parallel to an upper surface of a substrate and intersecting each other may be defined as first and second directions D1 and D2, respectively, and a direction substantially perpendicular to the upper surface of the substrate may be defined as a third direction D3. In example embodiments, the first and second directions D1 and D2 may be substantially perpendicular to each other.

Figure 1:
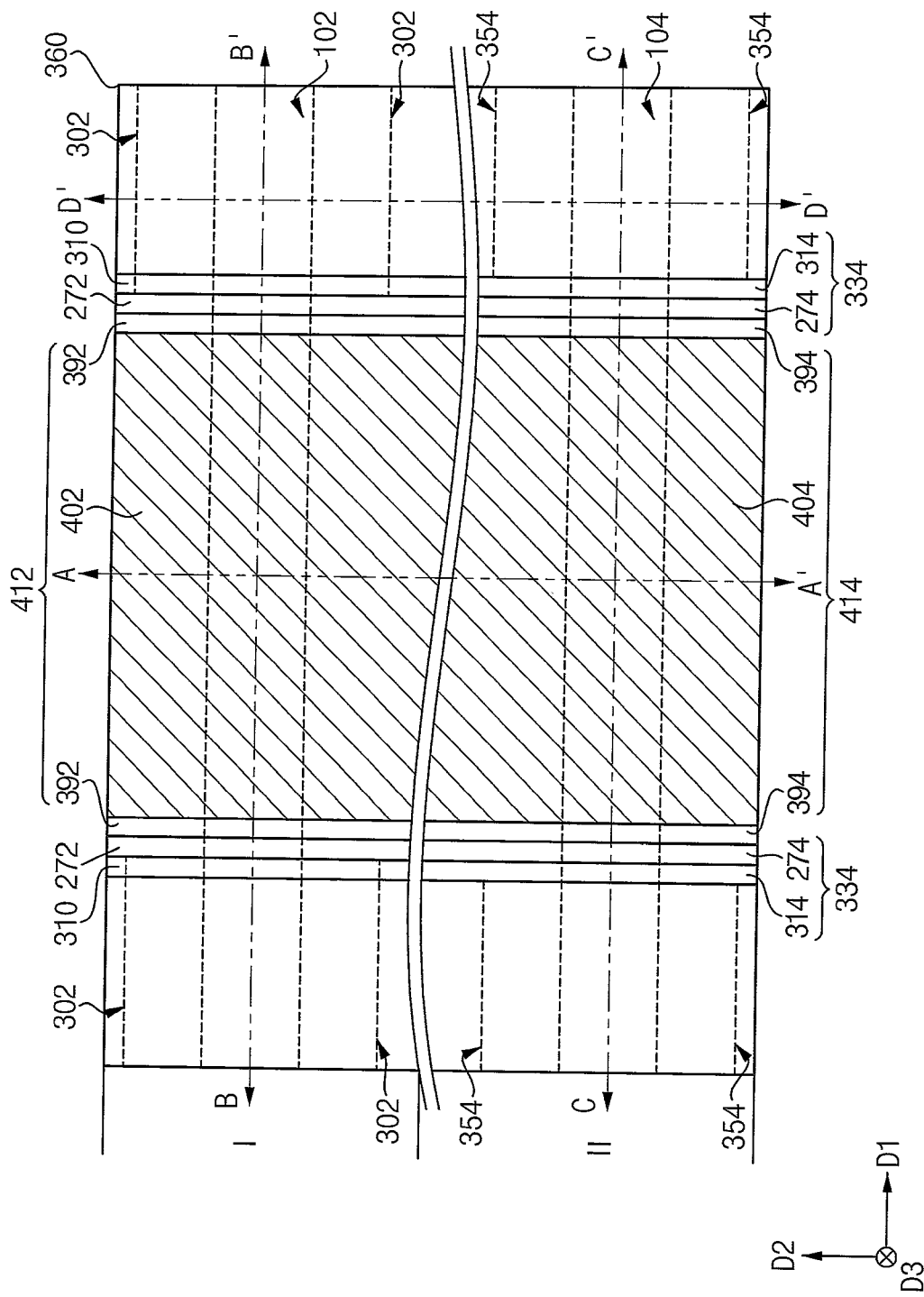
Figure 2:
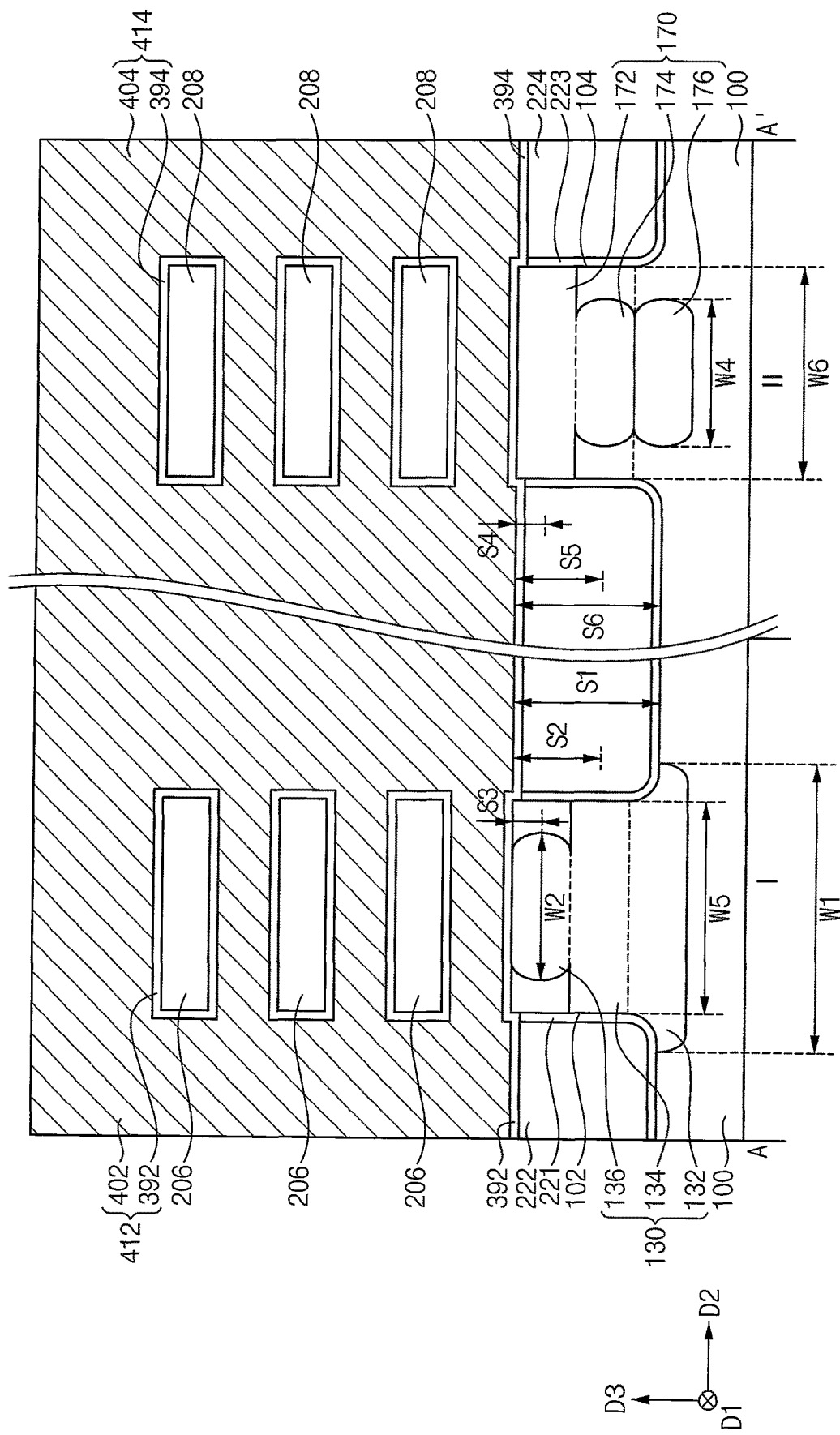
Figure 3:
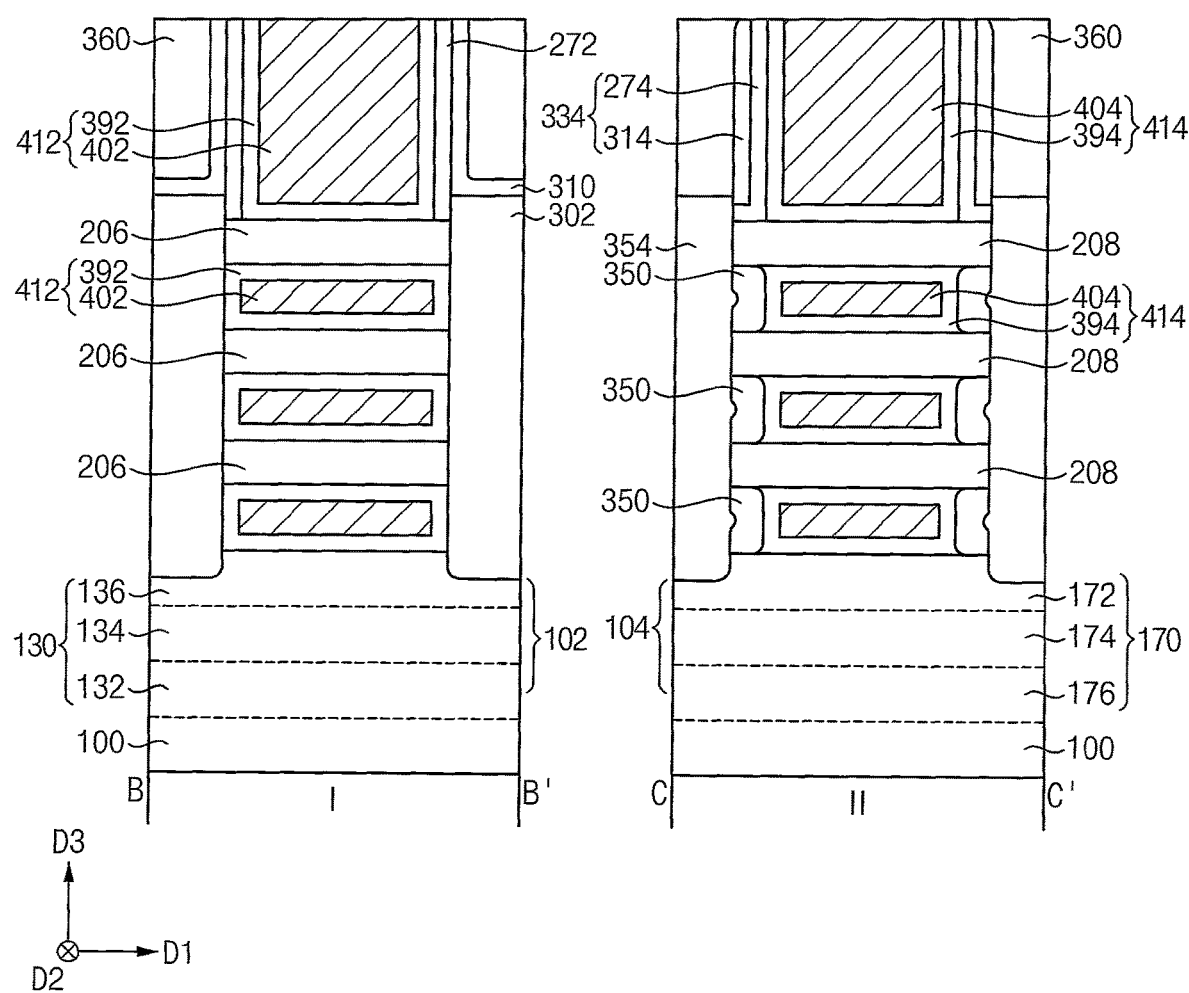
Figure 4:
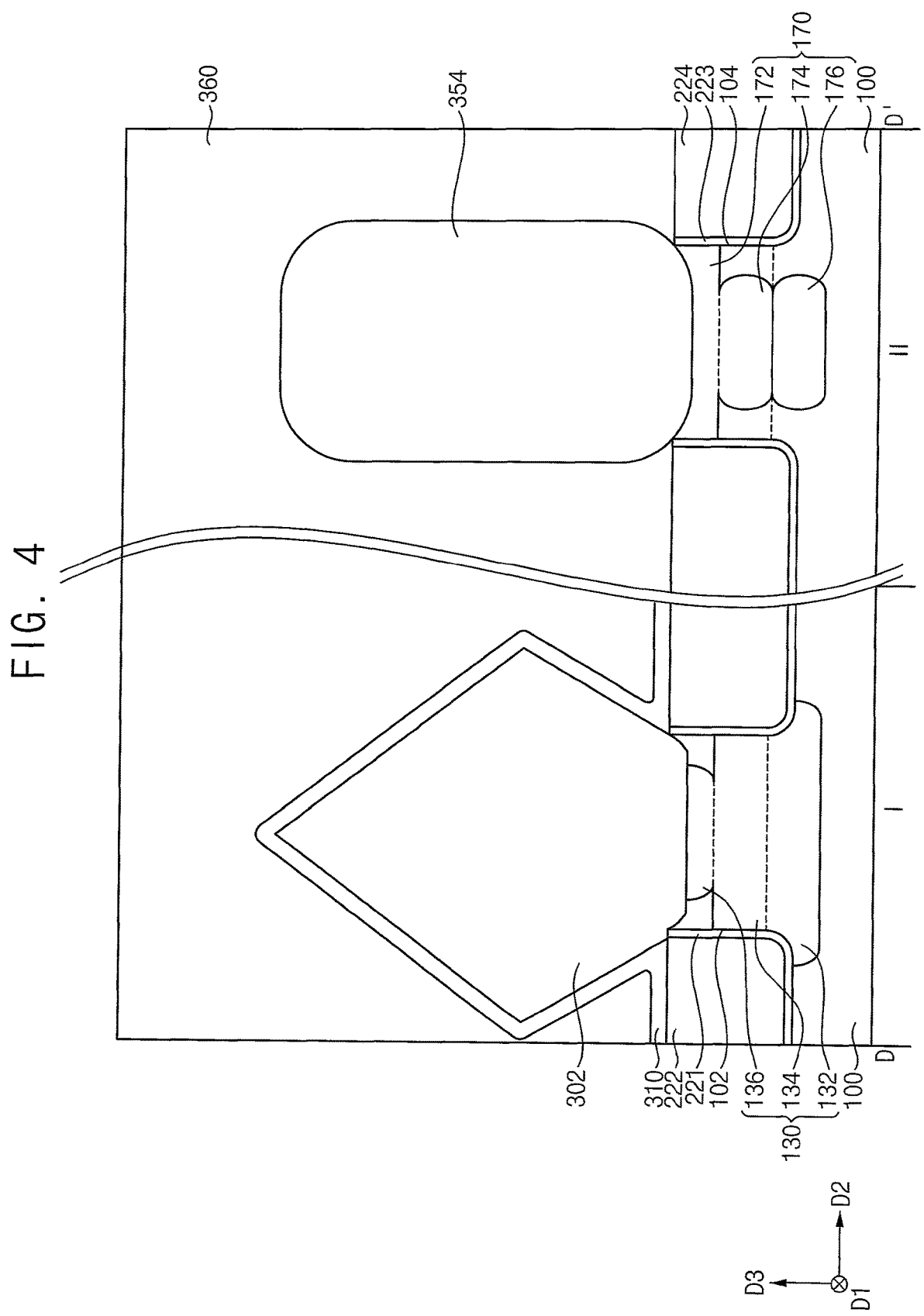

FIGS. 1 to 4 are a plan view and cross-sectional views illustrating a semiconductor device in accordance with example embodiments. Specifically, FIG. 1 is a plan view, and FIGS. 2 to 4 are the cross-sectional views. FIG. 2 is a cross-sectional view taken along line A-A' of FIG. 1, FIG. 3 includes cross-sectional views taken along lines B-B' and C-C', respectively, of FIG. 1, and FIG. 4 is a cross-sectional view taken along line D-D' of FIG. 1.

Referring to FIGS. 1 to 4, the semiconductor device may include first and second transistors on first and second regions I and II, respectively, of a substrate 100.

The substrate 100 may include a semiconductor material, e.g., silicon, germanium, silicon-germanium, etc., or a III-V group compound, e.g., GaP, GaAs, GaSb, etc. In example embodiments, the substrate 100 may be a silicon-on-insulator (SOI) substrate or a germanium-on-insulator (GOI) substrate.

The first and second regions I and II of the substrate 100 may be adjacent to each other, or spaced apart from each other. In an example embodiment, the first region I of the substrate 100 may be a p-type metal-oxide-semiconductor field-effect transistor (PMOS) region in which PMOS transistors may be formed, and the second region II of the substrate 100 may be an n-type metal-oxide-semiconductor field-effect transistor (NMOS) region in which NMOS transistors may be formed.

The first transistor may be formed on a first active pattern 102 on the first region I of the substrate 100, and may include a first gate structure 412, first semiconductor patterns 206, a first source/drain layer 302, a first gate spacer 272 and a second spacer layer 310.

The first active pattern 102 may have a fin shape protruding above an upper surface of the first region I of the substrate 100, and thus may also be referred to as a first active fin. In example embodiments, the first active pattern 102 may extend in the first direction D1, and may have a fifth width W5 in the second direction D2.

FIGS. 1 to 4 show only one first active pattern 102, however, the disclosure may not be limited thereto, and a plurality of first active patterns 102 may be spaced apart from each other in the second direction D2 on the first region I of the substrate 100. The first active pattern 102 may be formed by partially removing an upper portion of the substrate 100, and may include a material substantially the same as a material of the substrate 100, that is, a semiconductor material, e.g., silicon, germanium, etc.

A first liner 221 may be formed on a sidewall of the first active pattern 102 and the upper surface of the first region I of the substrate 100, and a first isolation pattern 222 surrounding the sidewall of the first active pattern 102 may be formed on the first liner 221. The first liner 221 and the first isolation pattern 222 may be not formed on a portion of the sidewall of the first active pattern 102. The first liner 221 may include a nitride, e.g., silicon nitride, and the first isolation pattern 222 may include an oxide, e.g., silicon nitride.

A first well 130 may be formed in the first region I of the substrate 100 and the first active pattern 102. In example embodiments, the first well 130 may include first, second and third impurity regions 132, 134 and 136 sequentially stacked in the third direction D3.

In an example embodiment, the first impurity region 132 may be formed at a lower portion of the first active pattern 102 and an upper portion of the substrate 100 adjacent thereto in the third direction D3, the second impurity region 134 may be formed at a central portion of the first active pattern 102 in the third direction D3, and the third impurity region 136 may be formed at an upper portion of the first active pattern 102. The first to third impurity regions 132, 134 and 136 may have first, second and third mean distances S1, S2 and S3, respectively, from an upper surface of the first active pattern 102 in the third direction D3.

In example embodiments, the first impurity region 132 may have a maximum width in the second direction D2, which is a first width W1, greater than the fifth width W5 of the first active pattern 102. That is, the first impurity region 132 may have a width in the second direction D2 that is greater than a width of a lower surface of the first active pattern 102, and may be formed at the lower portion of the first active pattern 102.

In example embodiments, the second impurity region 134 may have a width in the second direction D2 that may be substantially equal to the fifth width W5 of the first active pattern 102. The third impurity region 136 may have a second width W2 in the second direction D2 that may be smaller than the fifth width W5 of the first active pattern 102.

Alternatively, the first impurity region 132 may be formed only at the lower portion of the first active pattern 102, and may not be formed at the upper portion of the substrate 100 adjacent thereto. In this case, the first impurity region 132 may have a width in the second direction D2 that may be substantially equal to the fifth width W5 of the first active pattern 102.

The first to third impurity regions 132, 134 and 136 may include n-type impurities, e.g., phosphorus (P), arsenic (As), antimony (Sb), etc. In example embodiments, first and second impurity concentrations of the first and second impurity regions 132 and 134, respectively, may be greater than a third impurity concentration of the third impurity region 136. The first and second impurity concentrations may be substantially equal to or different from each other.

Each of the first semiconductor patterns 206 may extend in the first direction D1 through the first gate structure 412, and the first semiconductor patterns 206 may be spaced apart from each other in the third direction D3 to be at a plurality of levels, respectively. FIGS. 1 to 4 show the first semiconductor patterns 206 are formed at three levels, respectively, however, the disclosure may not be limited thereto. The first semiconductor patterns 206 may be formed at more or less than three levels, according to embodiments.

The first semiconductor patterns 206 may include a material substantially the same as that of the substrate 100 or the first active pattern 102, that is, silicon. In example embodiments, each of the first semiconductor patterns 206 may serve as a channel of the first transistor, and thus may also be referred to as a first channel.

The first gate structure 412 may be formed on the first active pattern 102 and portions of the first liner 221 and the first isolation pattern 222 adjacent to the first active pattern 102 in the second direction D2, and may surround each of the first semiconductor patterns 206.

FIGS. 1 to 4 show that the first gate structure 412 may surround the first semiconductor patterns 206 on one first active pattern 102, however, the disclosure may not be limited thereto. That is, the first gate structure 412 may extend on the first active pattern 102, the first liner 221 and the first isolation pattern 222 in the second direction D2 on the first region I of the substrate 100, and may be commonly formed on the first semiconductor patterns 206 on the first active patterns 102, respectively, spaced apart from each other in the second direction D2.

FIGS. 1 to 4 show that one first gate structure 412 is formed on the first region I of the substrate 100, however, the disclosure may not be limited thereto, and a plurality of first gate structures 412 may be formed to be spaced apart from each other in the first direction D1.

The first gate structure 412 may include a first interface pattern (not shown), a first gate insulation pattern 392 and a first gate electrode 402 sequentially stacked on the upper surface of the first active pattern 102 and a surface of each of the first semiconductor patterns 206.

The first interface pattern may be formed on the upper surface of the first active pattern 102 and the surface of each of the first semiconductor patterns 206, the first gate insulation pattern 392 may be formed on a surface of the first interface pattern and an inner sidewall of the first gate spacer 272, and the first gate electrode 402 may fill a space between the first semiconductor patterns 206 in the third direction D3, a space between the first active pattern 102 and a lowermost one of the first semiconductor patterns 206, and a space between inner sidewalls of the first gate spacers 272 on an uppermost one of the first semiconductor patterns 206.

The first interface pattern may include an oxide, e.g., silicon oxide, the first gate insulation pattern 392 may include a metal oxide having a high dielectric constant, e.g., hafnium oxide, tantalum oxide, zirconium oxide, etc.

In an example embodiment, the first gate electrode 402 may include a first work function control pattern and a first metal pattern stacked on the first gate insulation pattern 392. The first work function control pattern may include, e.g., titanium nitride, titanium oxynitride, tantalum nitride, tantalum oxynitride, tungsten nitride, tungsten carbonitride, aluminum oxide, etc., the first metal pattern may include a metal, e.g., titanium, aluminum, etc., or a metal alloy.

The first gate spacer 272 may be formed on each of opposite sidewalls in the first direction D1 of a portion of the first gate structure 412 on the uppermost one of the first semiconductor patterns 206. The second spacer layer 310 may be formed on an outer sidewall of the first gate spacer 272 and a surface of the first source/drain layer 302. Each of the first gate spacer 272 and the second spacer layer 310 may include a nitride, e.g., silicon oxynitride, silicon oxycarbonitride, etc. If the first spacer 272 and the second spacer layer 310 include the same material, the first spacer 272 and the second spacer layer 310 may be merged with each other or formed as a single structure.

The first source/drain layer 302 may extend in the third direction D3 from the upper surface of the first active pattern 102, and may commonly contact sidewalls in the first direction D1 of the first semiconductor patterns 206 at respective levels. In some embodiments, the first source/drain layer 302 may contact a lower portion of the outer sidewall of the first gate spacer 272.

In example embodiments, a cross-section of the first source/drain layer 302 in the second direction D2 may have a shape of, e.g., a pentagon. In example embodiments, the first source/drain layer 302 may include silicon-germanium doped with one or more p-type impurities, e.g., boron, gallium, indium, etc., and thus may serve as a source/drain of a PMOS transistor.

The first transistor may include the first semiconductor patterns 206 stacked in the third direction D3, and thus may be referred to as a multi-bridge channel field-effect-transistor (MBCFET) or nanosheet transistor.

The second transistor may be formed on a second active pattern 104 on the second region II of the substrate 100, and may include a second gate structure 414, second semiconductor patterns 208, a second source/drain layer 354, a second gate spacer structure 334 and an inner spacer 350.

The second active pattern 104 may have a fin shape protruding above an upper surface of the second region II of the substrate 100, and thus may also be referred to as a second active fin. In example embodiments, the second active pattern 104 may extend in the first direction D1, and may have a sixth width W6 in the second direction D2.

FIGS. 1 to 4 show only one second active pattern 104, however, the disclosure may not be limited thereto, and a plurality of second active patterns 104 may be spaced apart from each other in the second direction D2 on the second region II of the substrate 100. The second active pattern 104 may be formed by partially removing an upper portion of the substrate 100, and may include a material substantially the same as a material of the substrate 100, that is, a semiconductor material, e.g., silicon, germanium, etc. Accordingly, the second active pattern 104 may include a material substantially the same as that of the first active pattern 102.

A second liner 223 may be formed on a sidewall of the second active pattern 104 and the upper surface of the second region II of the substrate 100, and a second isolation pattern 224 surrounding the sidewall of the second active pattern 104 may be formed on the second liner 223. The second liner 223 and the second isolation pattern 224 may be not formed on a portion of the sidewall of the second active pattern 104. The second liner 223 and the second isolation pattern 224 may include substantially the same materials as those of the first liner 221 and the first isolation pattern 222, respectively.

A second well 170 may be formed in the second region II of the substrate 100 and the second active pattern 104. In example embodiments, the second well 170 may include sixth, fifth and fourth impurity regions 176, 174 and 172 sequentially stacked in the third direction D3.

In an example embodiment, the sixth impurity region 176 may be formed at a lower portion of the second active pattern 104 and an upper portion of the substrate 100 adjacent thereto in the third direction D3, the fifth impurity region 174 may be formed at a central portion of the second active pattern 104 in the third direction D3, and the fourth impurity region 172 may be formed at an upper portion of the second active pattern 104. The fourth to sixth impurity regions 172, 174 and 176 may have fourth, fifth and sixth mean distances S4, S5 and S6, respectively, from an upper surface of the second active pattern 104 in the third direction D3.

In example embodiments, the fourth impurity region 172 may have a width in the second direction D2 that may be substantially equal to the sixth width W6 of the second active pattern 104. Each of the fifth and sixth impurity regions 174 and 176 may have a fourth width W4 in the second direction D2 that may be smaller than the sixth width W6 of the second active pattern 104.

The fourth to sixth impurity regions 172, 174 and 176 may include one or more p-type impurities, e.g., boron (B), gallium (Ga), indium (In), etc. In example embodiments, fifth and sixth impurity concentrations of the fifth and sixth impurity regions 174 and 176, respectively, may be smaller than a fourth impurity concentration of the fourth impurity region 172. The fifth and sixth impurity concentrations may be substantially equal to or different from each other.

Each of the second semiconductor patterns 208 may extend in the first direction D1 through the second gate structure 414, and the second semiconductor patterns 208 may be spaced apart from each other in the third direction D3 to be at a plurality of levels, respectively. FIGS. 1 to 4 show the second semiconductor patterns 208 are formed at three levels, respectively, however, the disclosure may not be limited thereto. The semiconductor patterns 208 may be formed at more or less than three levels, according to embodiments The second semiconductor patterns 208 may include a material substantially the same as that of the first semiconductor patterns 206, and may be formed at the same levels as those of corresponding ones of the first semiconductor patterns 206. In example embodiments, each of the second semiconductor patterns 208 may serve as a channel of the second transistor, and thus may also be referred to as a second channel.

The second gate structure 414 may be formed on the second active pattern 104 and portions of the second liner 223 and the second isolation pattern 224 adjacent to the second active pattern 104 in the second direction D2, and may surround each of the second semiconductor patterns 208.

FIGS. 1 to 4 show that the second gate structure 414 may surround the second semiconductor patterns 208 on one second active pattern 104, however, the disclosure may not be limited thereto. That is, the second gate structure 414 may extend on the second active pattern 104, the second liner 223 and the second isolation pattern 224 in the second direction D2 on the second region II of the substrate 100, and may be commonly formed on the second semiconductor patterns 208 on the second active patterns 104, respectively, spaced apart from each other in the second direction D2.

FIGS. 1 to 4 show that one second gate structure 414 is formed on the second region II of the substrate 100, however, the disclosure may not be limited thereto, and a plurality of second gate structures 414 may be formed to be spaced apart from each other in the first direction D1.

The second gate structure 414 may include a second interface pattern (not shown), a second gate insulation pattern 394 and a second gate electrode 404 sequentially stacked on the upper surface of the second active pattern 104 and a surface of each of the second semiconductor patterns 208.

The second interface pattern may be formed on the upper surface of the second active pattern 104 and the surface of each of the second semiconductor patterns 208, the second gate insulation pattern 394 may be formed on a surface of the second interface pattern, an inner sidewall of the second gate spacer structure 334 and an inner sidewall of the inner spacer 350, and the second gate electrode 404 may fill a space between the second semiconductor patterns 208 in the third direction D3, a space between the second active pattern 104 and a lowermost one of the second semiconductor patterns 208, and a space between inner sidewalls of the second gate spacer structures 334 on an uppermost one of the second semiconductor patterns 208.

The second interface pattern, the second gate insulation pattern 394 and the second gate electrode 404 may include materials substantially the same as those of the first interface pattern, the first gate insulation pattern 392 and the first gate electrode 402, respectively. Alternatively, the second interface pattern, the second gate insulation pattern 394 and the second gate electrode 404 may include materials different from those of the first interface pattern, the first gate insulation pattern 392 and the first gate electrode 402, respectively.

The second gate spacer structure 334 may be formed on each of opposite sidewalls in the first direction D1 of a portion of the second gate structure 414 on the uppermost one of the second semiconductor patterns 208. The inner spacer 350 may be formed on each of opposite sidewalls in the first direction D1 of a portion of the second gate structure 414 under the uppermost one of the second semiconductor patterns 208.

The second gate spacer structure 334 may include a third gate spacer 274 on the sidewall of the portion of the second gate structure 414 on the uppermost one of the second semiconductor patterns 208, and a fourth gate spacer 314 on an outer sidewall of the third gate spacer 274. In example embodiments, a cross-section of the third gate spacer 274 in the first direction D1 as shown in FIG. 3 may have a shape of an "L." The third gate spacer 274 and the fourth gate spacer 314 may include materials substantially the same as those of the first gate spacer 272 and the second spacer layer 310, respectively. If the third and fourth gate spacers 274 and 314 include substantially the same materials, the third and fourth gate spacers 274 and 314 may be merged with each other or formed as a single structure.

The inner spacer 350 may be formed between the second semiconductor patterns 208 spaced apart from each other in the third direction D3, and may be formed on each of opposite sidewalls in the first direction D1 of the portion of the second gate structure 414 under the uppermost one of the second semiconductor patterns 20. In an example embodiment, a cross-section of the inner spacer 350 in the first direction D1 as shown in FIG. 3 may have a shape of a horseshoe or a semicircle with a recess on a sidewall thereof. The inner spacer 350 may include a nitride, e.g., silicon nitride.

The second source/drain layer 354 may extend in the third direction D3 from the upper surface of the second active pattern 104, and may commonly contact sidewalls in the first direction D1 of the second semiconductor patterns 208 at respective levels. In some embodiments, the second source/drain layer 304 may contact a lower portion of the outer sidewall of the second gate spacer structure 334.

In example embodiments, a cross-section of the second source/drain layer 354 in the second direction D2 may have a shape of, e.g., a rectangle with rounded corners. In example embodiments, the second source/drain layer 354 may include silicon or silicon carbide doped with one or more n-type impurities, and thus may serve as a source/drain of an NMOS transistor.

The second transistor may include the second semiconductor patterns 208 stacked in the third direction D3, and thus may be referred to as an MBCFET or nanosheet transistor.

The semiconductor device may further include an insulation layer 360 formed on upper surfaces of the first and second source/drain layers 302 and 354 and sidewalls of the first and second gate structures 412 and 414. The insulation layer 360 may include an oxide, e.g., silicon oxide. The semiconductor device may further include contact plugs, wirings, etc., electrically connected to the first and second source/drain layers 302 and 354 and/or the first and second gate structures 412 and 414.

In the semiconductor device, the second well 170 including the fourth to sixth impurity regions 172, 174 and 176 doped with one or more p-type impurities may be formed in the second active pattern 104 on which the second transistor may be formed. The fourth impurity region 172 at the upper portion of the second active pattern 104 may have the impurity concentration and the width in the second direction D2 that are greater than the impurity concentrations and the widths in the second direction D2, respectively, of the fifth and sixth impurity regions 174 and 176 under the fourth impurity region 172. Thus, a punch-through phenomenon that may occur through the upper portion of the second active pattern 104 in the NMOS transistor may be reduced or prevented.

In the semiconductor device, the first well 130 including the first to third impurity regions 132, 134 and 136 doped with one or more n-type impurities may be formed in the first active pattern 102 on which the first transistor may be formed. The first impurity region 132 at the lower portion of the first active pattern 102 may have the impurity concentration and the width in the second direction D2 that are greater than the impurity concentrations and the widths in the second direction D2, respectively, of the second and third impurity regions 134 and 136 over the first impurity region 132. Thus, a leakage current from the first active pattern 102 on which the PMOS transistor is formed to the second active pattern 104 on which the NMOS transistor is formed may be reduced or prevented.

FIGS. 5 to 32 are plan views and cross-sectional views illustrating a method of manufacturing a semiconductor device in accordance with example embodiments. Specifically, FIGS. 5, 8, 12, 14, 17, 20, 23, 27 and 30 are the plan views, and FIGS. 6-7, 9-11, 13, 15-16, 18-19, 21-22, 24-26, 28-29 and 31-32 are the cross-sectional views.

FIGS. 6-7, 9-11, 13, 15 and 31 are cross-sectional views taken along lines A-A' of corresponding plan views, respectively, FIGS. 16, 18, 21, 24, 26, 28 and 32 include cross-sectional views taken along lines B-B' and C-C' of corresponding plan views, respectively, and FIGS. 19, 22, 25 and 29 are cross-sectional views taken along lines D-D' of corresponding plan views, respectively.

Figure 5:
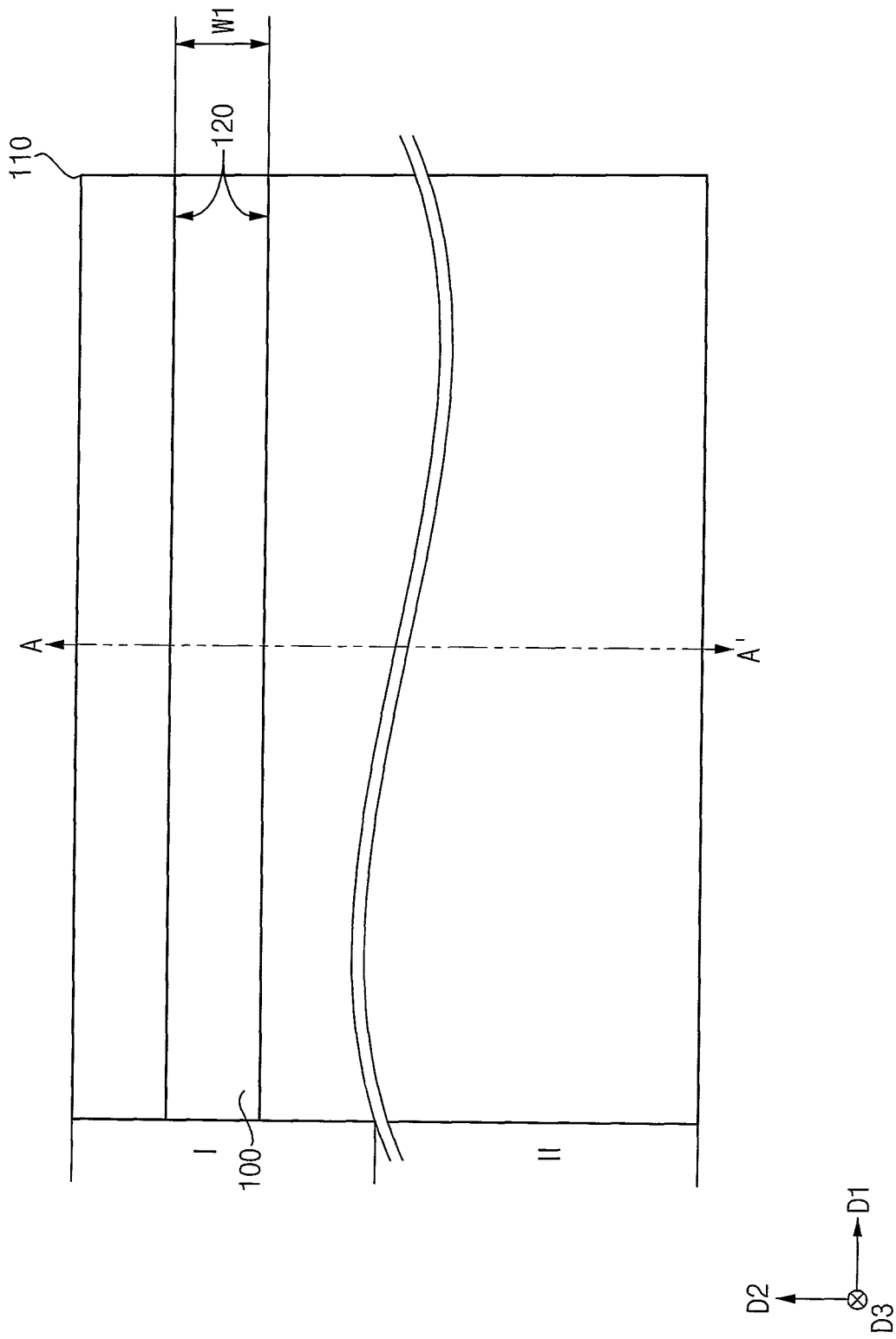
Figure 6:
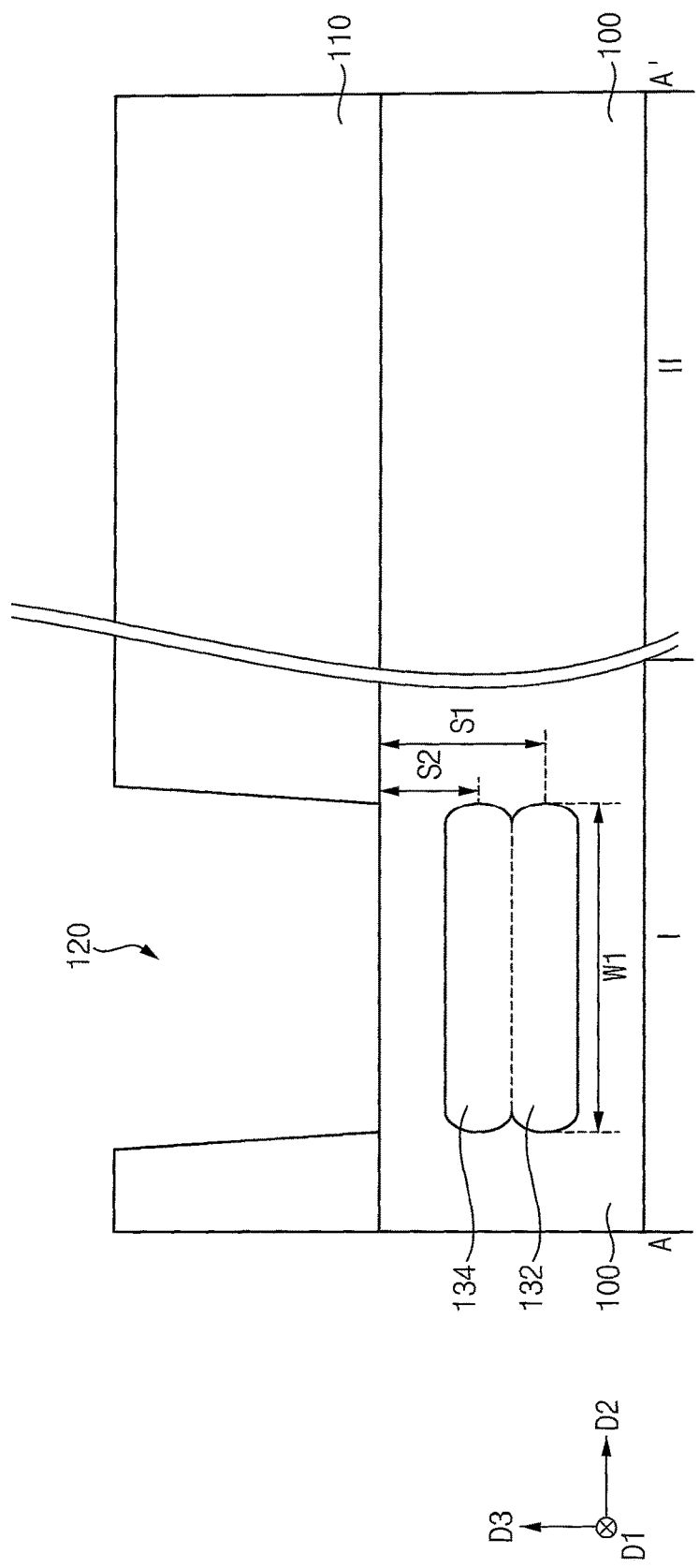

Referring to FIGS. 5 and 6, a first ion implantation mask 110 having a first opening 120 may be formed on a substrate 100 including first and second regions I and II, and impurities may be doped into the substrate 100 through the first opening 120 by a first ion implantation process.

The first ion implantation mask 110 may include an insulating nitride, e.g., silicon nitride.

In example embodiments, the first opening 120 may extend in the first direction D1 on the first region I of the substrate 100, and a plurality of first openings 120 may be spaced apart from each other in the second direction D2 although FIGS. 5 and 6 show one first opening 120.

The first ion implantation process may be performed by targeting a portion of the substrate 100 spaced apart from an upper surface of the substrate 100 by a given distance. In example embodiments, the first ion implantation process may be performed by targeting portions of the substrate 100 spaced apart from the upper surface of the substrate 100 by first and second mean distances S1 and S2, respectively, and thus first and second impurity regions 132 and 134 may be formed in the first region I of the substrate 100. The first mean distance S1 may be greater than the second mean distance S2.

In example embodiments, the first opening 120 may have a first width W1 in the second direction D2, and each of the first and second impurity regions 132 and 134 that may be formed through the first opening 120 may also have the first width W1 in the second direction D2. However, in some embodiments, a heat treatment process may be further performed after the first ion implantation process, and in this case, the impurities doped in the first and second impurity regions 132 and 134 may diffuse into a neighboring area, so that each of the first and second impurity regions 132 and 134 may have a width greater than the first width W1.

In example embodiments, each of the first and second impurity regions 132 and 134 may include one or more n-type impurities, e.g., phosphorus (P), arsenic (As), antimony (Sb), etc.

In an example embodiment, a first impurity concentration of the impurities doped in the first impurity region 132 may be substantially equal to a second impurity concentration of the impurities in the second impurity region 134. Alternatively, the first and second impurity concentrations may be different from each other.

Figure 7:
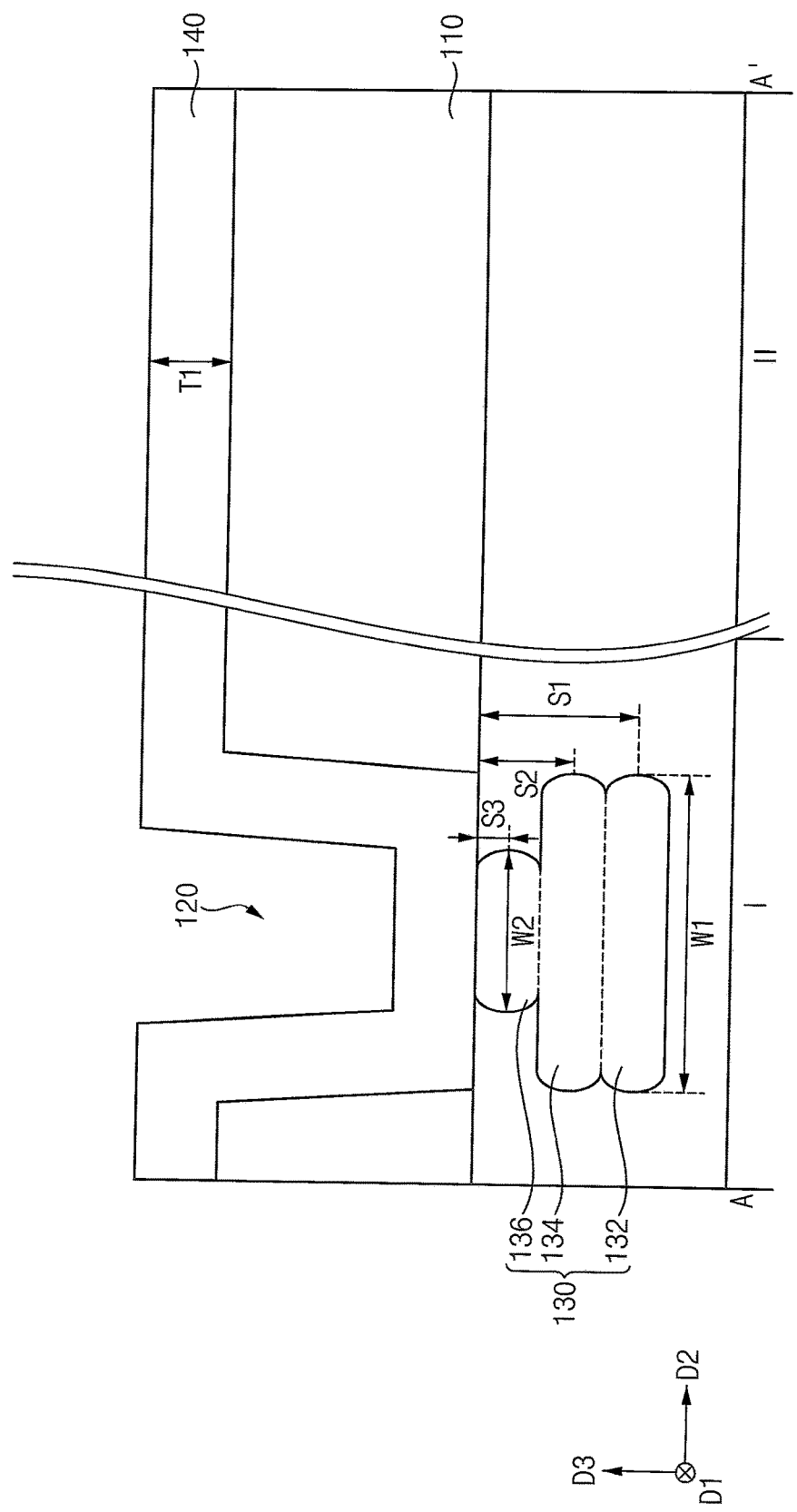

Referring to FIG. 7, a first sacrificial spacer layer 140 may be formed on the substrate 100 with the first ion implantation mask 110 thereon, and impurities may be doped into the substrate 100 through the first opening 120 by a second ion implantation process.

In example embodiments, the first sacrificial spacer layer 140 may be formed by an atomic layer deposition (ALD) process, and may include an oxide, e.g., silicon oxide. The first sacrificial spacer layer 140 may have a first thickness T1.

Thus, the first width W1 of the first opening 120 may be reduced to a second width W2 by twice the first thickness T1 of the first sacrificial spacer layer 140 on opposite sidewalls of the first opening 120.

The second ion implantation process may be performed through the first opening 120 having the reduced width, that is, the second width W2, by targeting a portion of the substrate 100 spaced apart from the upper surface of the substrate 100 by a third mean distance S3 that may be smaller than the first and second mean distances S1 and S2.

Thus, the third impurity region 136 may be formed on the second impurity region 134, and may have the second width W2 in the second direction D2 that may be smaller than the first width W1. However, in some embodiments, a heat treatment process may be further performed after the second ion implantation process, and in this case, the impurities doped in the third impurity region 136 may diffuse into a neighboring area, so that the third impurity region 136 may have a width greater than the second width W2.

In example embodiments, the third impurity region 136 may include one or more n-type impurities, e.g., phosphorus (P), arsenic (As), antimony (Sb), etc.

In example embodiments, a third impurity concentration of the impurities in the third impurity region 136 may be smaller than the first and second impurity concentrations of the first and second impurity regions 132 and 134.

The first to third impurity regions 132, 134 and 136 in the first region I of the substrate 100 may collectively form a first well 130.

The first sacrificial spacer layer 140 and the first ion implantation mask 110 may be removed.

Figure 8:
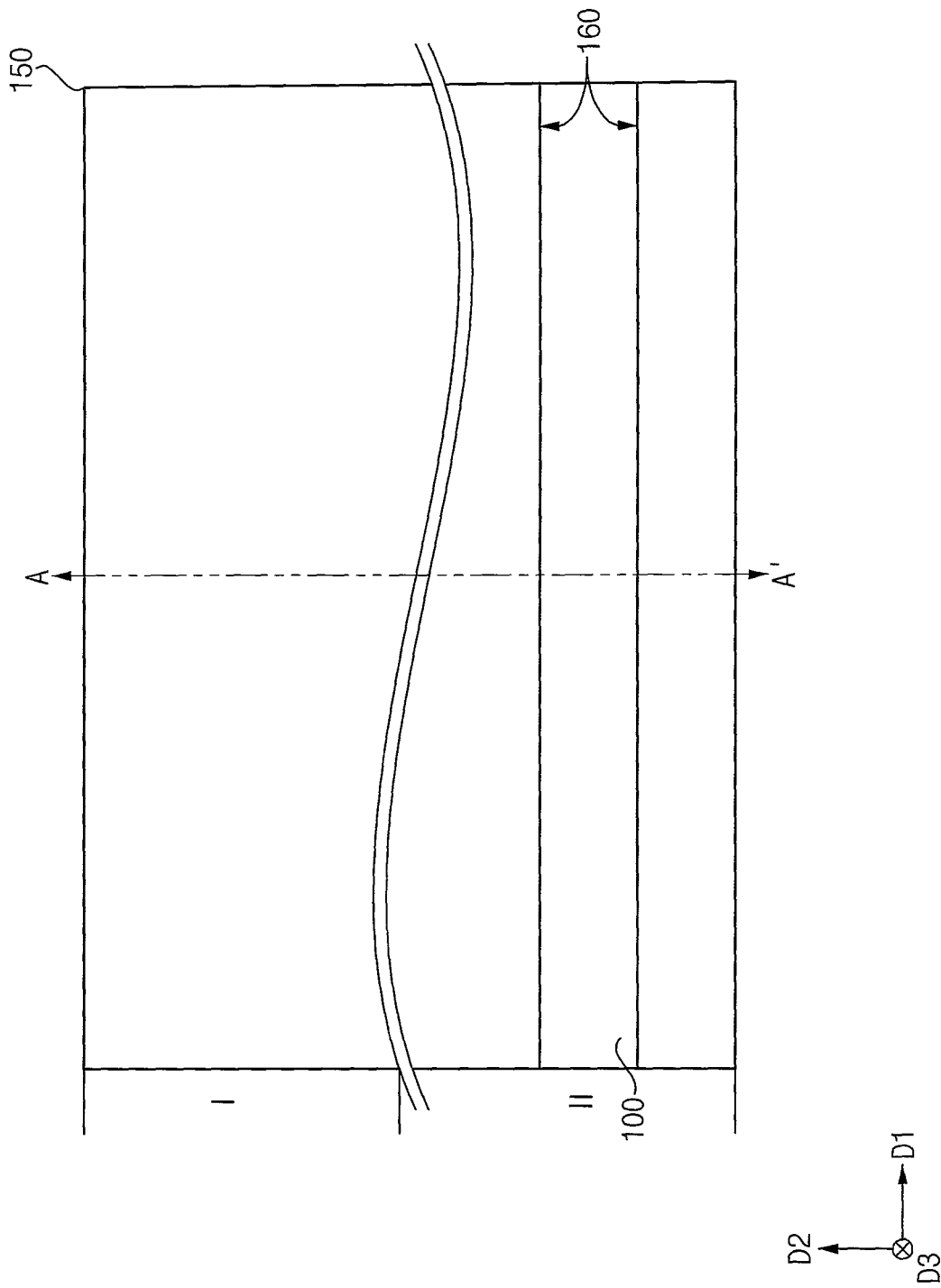
Figure 9:
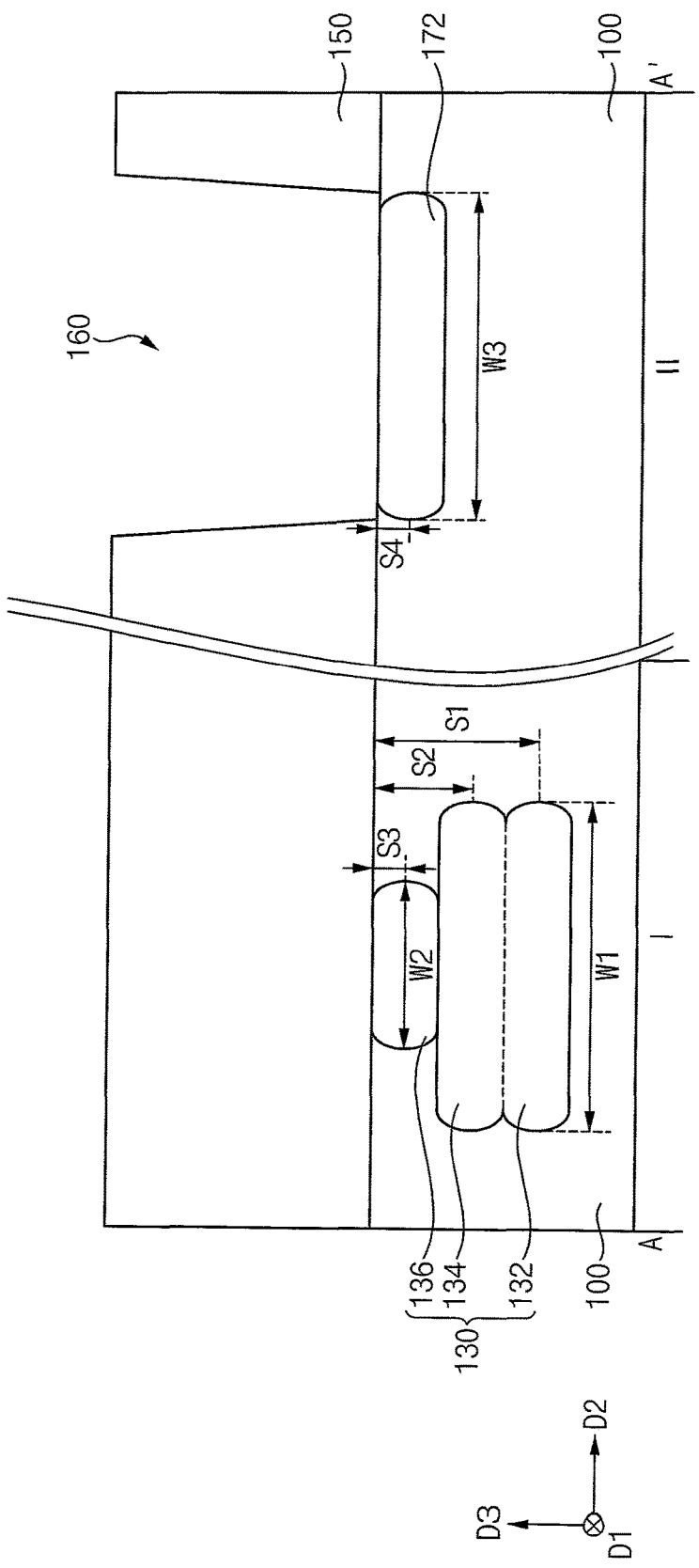

Referring to FIGS. 8 and 9, a second ion implantation mask 150 having a second opening 160 may be formed on the substrate 100, and a third ion implantation process may be performed so that impurities may be doped into the substrate 100 through the second opening 160.

The second ion implantation mask 150 may include an insulating nitride, e.g., silicon nitride.

In example embodiments, the second opening 160 may extend in the first direction D1 on the second region II of the substrate 100, and a plurality of second openings 160 may be spaced apart from each other in the second direction D2 although FIGS. 8 and 9 show one second opening 160.

The third ion implantation process may be performed by targeting a portion of the substrate 100 spaced apart from the upper surface of the substrate 100 by a given distance. In example embodiments, the third ion implantation process may be performed by targeting a portion of the substrate 100 spaced apart from the upper surface of the substrate 100 by a fourth mean distance S4, and thus a fourth impurity region 172 may be formed in the second region II of the substrate 100. The fourth mean distance S4 may be equal to or different from the third mean distance S3.

In example embodiments, the second opening 160 may have a third width W3 in the second direction D2, and the fourth impurity region 172 may also have the third width W3 in the second direction D2. However, a heat treatment process may be further performed after the third ion implantation process, and in this case, the impurities doped in the fourth impurity region 172 may diffuse into a neighboring area, so that the fourth impurity region 172 may have a width greater than the third width W3.

The third width W3 may be equal to or different from the first width W1.

In example embodiments, the fourth impurity region 172 may include one or more p-type impurities, e.g., boron (B), gallium (Ga), indium (In), etc.

Figure 10:
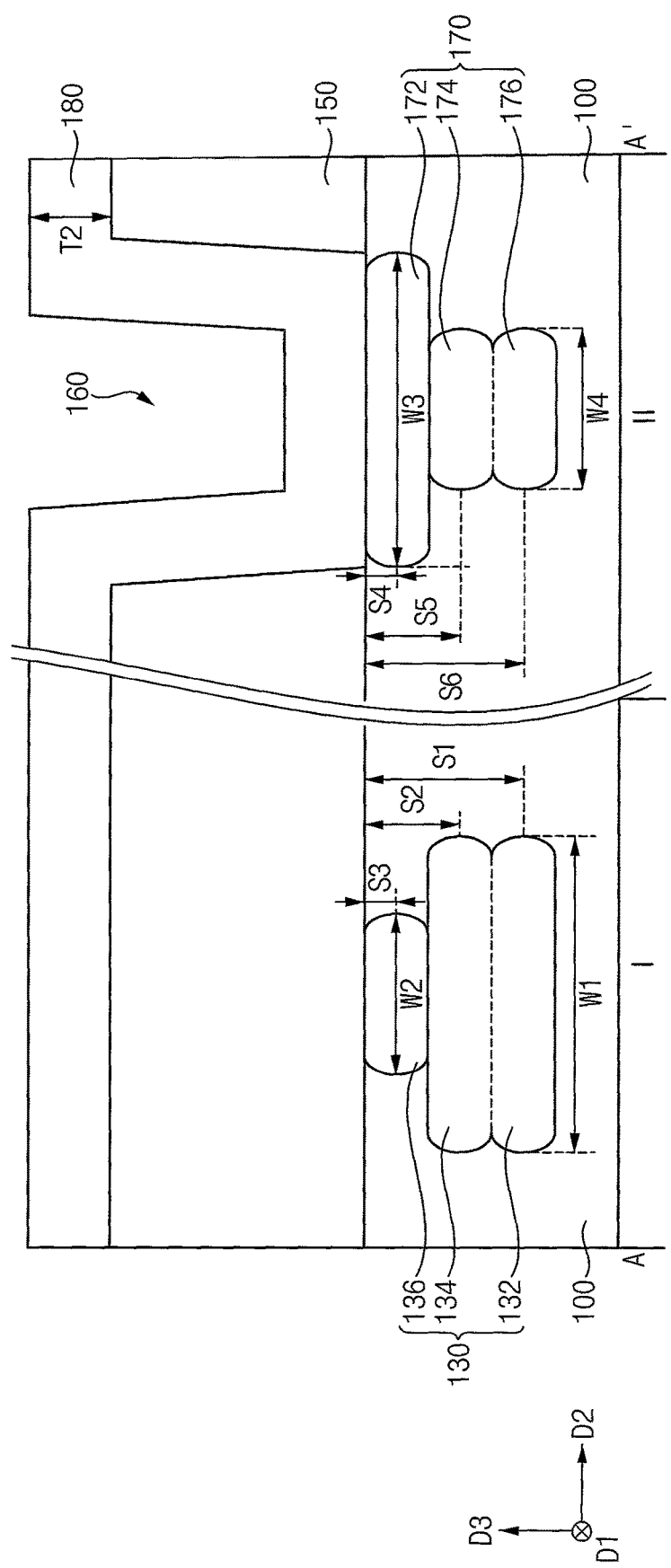

Referring to FIG. 10, a second sacrificial spacer layer 180 may be formed on the substrate 100 having the second ion implantation mask 150 thereon, and a fourth ion implantation process may be performed through the second opening 160 so that impurities may be doped into the substrate 100.

In example embodiments, the second sacrificial spacer layer 180 may be formed by an ALD process, and may include an oxide, e.g., silicon oxide. The second sacrificial spacer layer 180 may have a second thickness T2. The second thickness T2 may be equal to or different from the first thickness T1.

Thus, the third width W3 of the second opening 160 may be reduced to a fourth width W4 by twice the second thickness T2 of the second sacrificial spacer layer 180 on opposite sidewalls of the second opening 160.

The fourth ion implantation process may be performed through the second opening 160 having the reduced width, that is, the fourth width W4, by targeting portions of the substrate 100 spaced apart from the upper surface of the substrate 100 by fifth and sixth mean distances S5 and S6, respectively, that may be greater than the fourth distance S4. The sixth mean distance S6 may be greater than the fifth mean distance S5. The fifth and sixth mean distances S5 and S6 may be equal to or different from the second and first mean distances S2 and S1, respectively.

Thus, the fifth and sixth impurity regions 174 and 176 may be formed under the fourth impurity region 172, and may have the fourth width W4 in the second direction D2 that may be smaller than the third width W3. However, in some embodiments, a heat treatment process may be further performed after the fourth ion implantation process, and in this case, the impurities doped in the fifth and sixth impurity regions 174 and 176 may diffuse into a neighboring area, so that each of the fifth and sixth impurity regions 174 and 176 may have a width greater than the fourth width W4.

In example embodiments, each of the fifth and sixth impurity regions 174 and 176 may include one or more p-type impurities, e.g., boron (B), gallium (Ga), indium (In), etc.

In example embodiments, fifth and sixth impurity concentrations of the impurities in the fifth and sixth impurity regions 174 and 176, respectively, may be smaller than the fourth impurity concentration of the fourth impurity region 172. The fifth and sixth impurity concentrations may be equal to or different from each other.

The second sacrificial spacer layer 180 and the second ion implantation mask 150 may be removed.

The fourth to sixth impurity regions 172, 174 and 176 in the second region II of the substrate 100 may collectively form a second well 170.

In example embodiments, the first well 130 may be formed, and then the second well 170 may be formed. Alternatively, the second well 170 may be formed, and then the first well 130 may be formed. Further, among the third and fourth ion implantation processes, the fourth ion implantation process forming the sixth and fifth impurity regions 176 and 174 may be performed before the third ion implantation process forming the fourth impurity region 172, according to an example embodiment.

Figure 11:
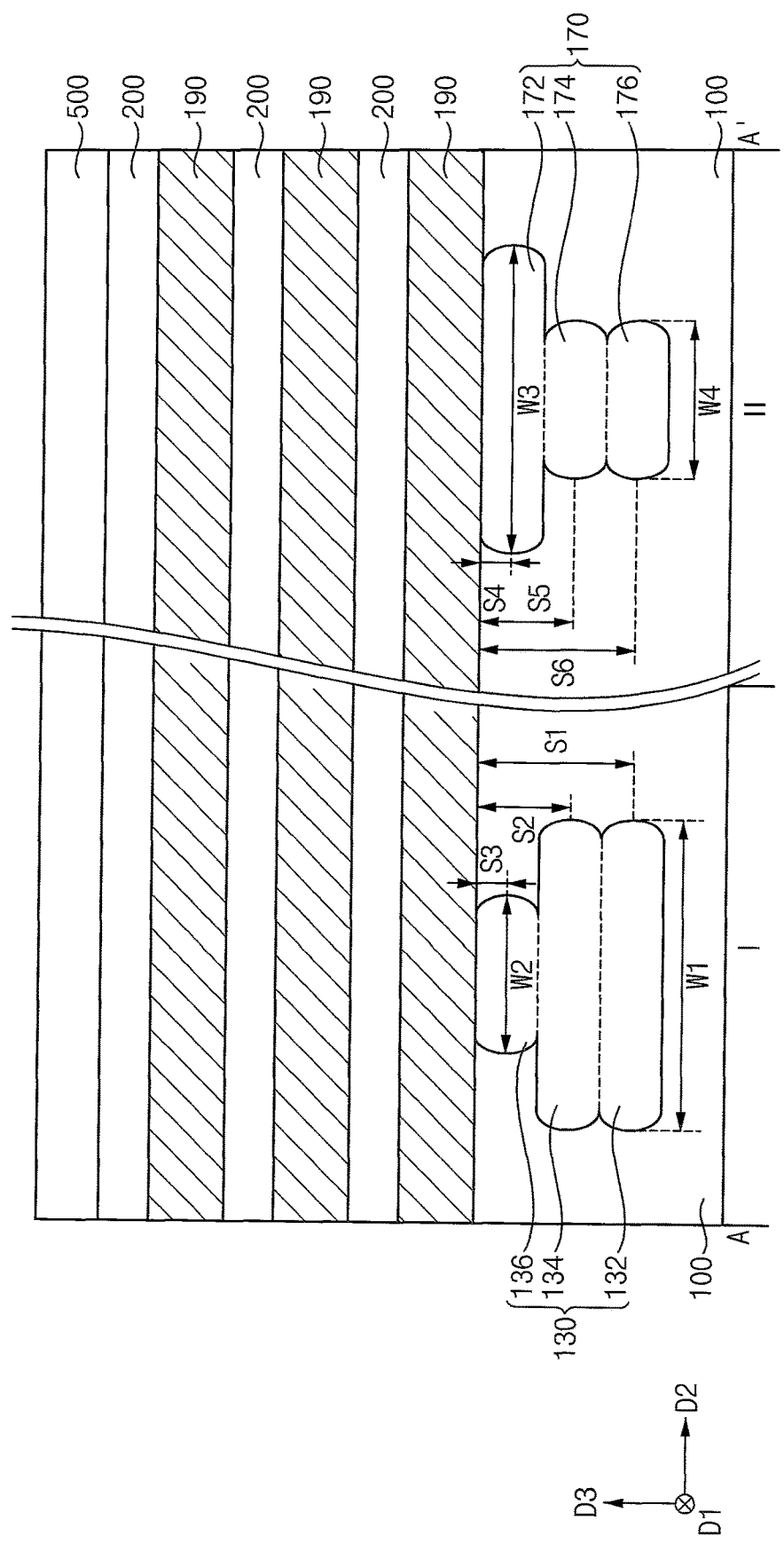

Referring to FIG. 11, a sacrificial layer 190 and a semiconductor layer 200 may be alternately and repeatedly stacked on the first and second regions I and II of the substrate 100, and an etching mask layer 500 may be formed on an uppermost one of the semiconductor layers 200.

In example embodiments, the sacrificial layer 190 and the semiconductor layer 200 may be formed by a selective epitaxial growth (SEG) process using an upper portion of the substrate 100 as a seed.

In an example embodiment, the sacrificial layer 190 may be formed by an SEG process using a silicon source gas, e.g., dichlorosilane ($SiH_2Cl_2$) gas, a germanium source gas, e.g., germane ($GeH_4$) gas, and thus a single crystalline silicon-germanium layer may be formed. In an example embodiment, the semiconductor layer 200 may be formed by an SEG process using a silicon source gas, e.g., disilane ($Si_2H_6$) gas, and thus a single crystalline silicon layer may be formed.

The etching mask layer 500 may include a nitride, e.g., silicon nitride, and in some embodiments, a pad layer including, e.g., silicon oxide may be further formed between the uppermost one of the semiconductor layers 200 and the etching mask layer 500.

Figure 12:
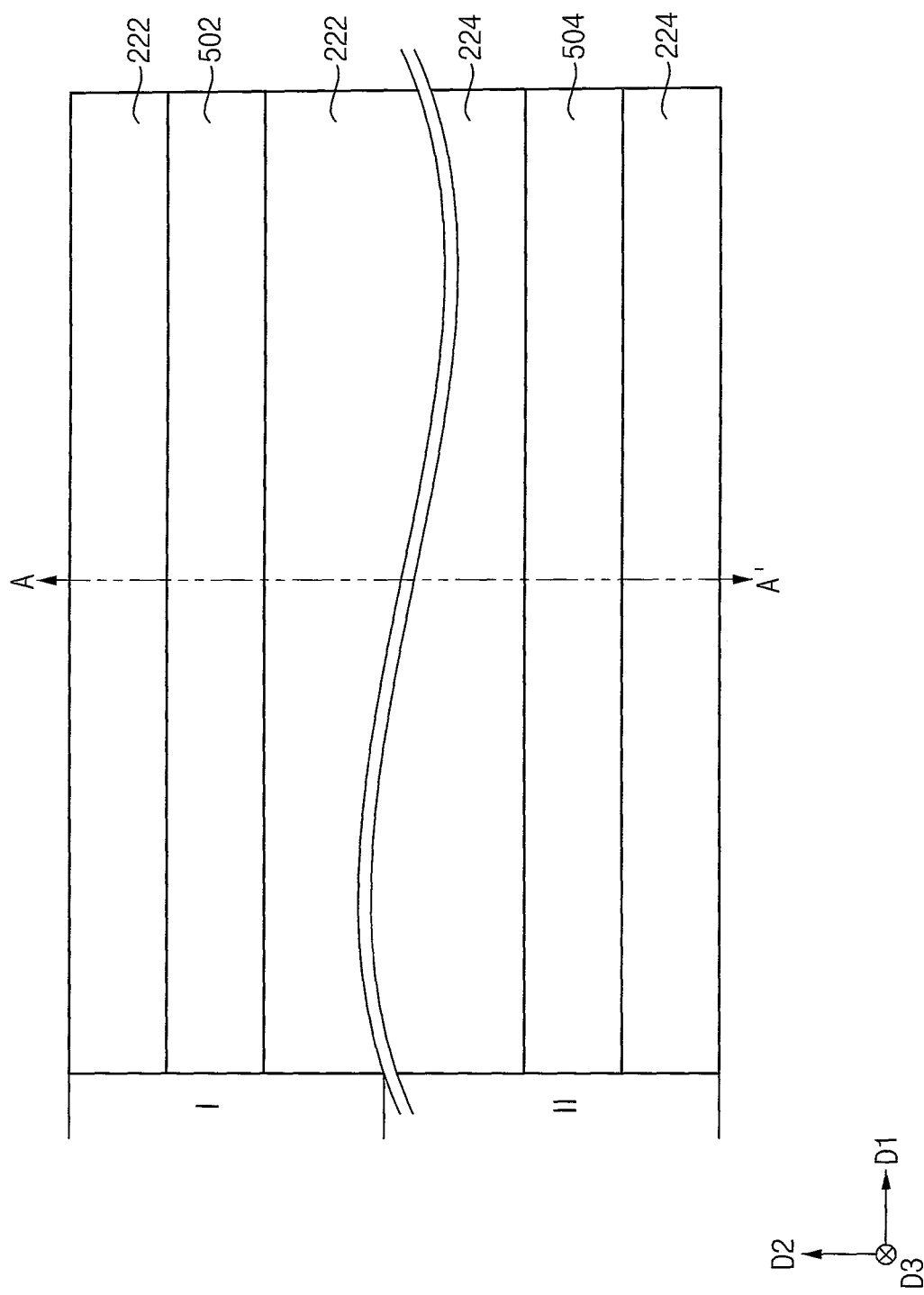
Figure 13:
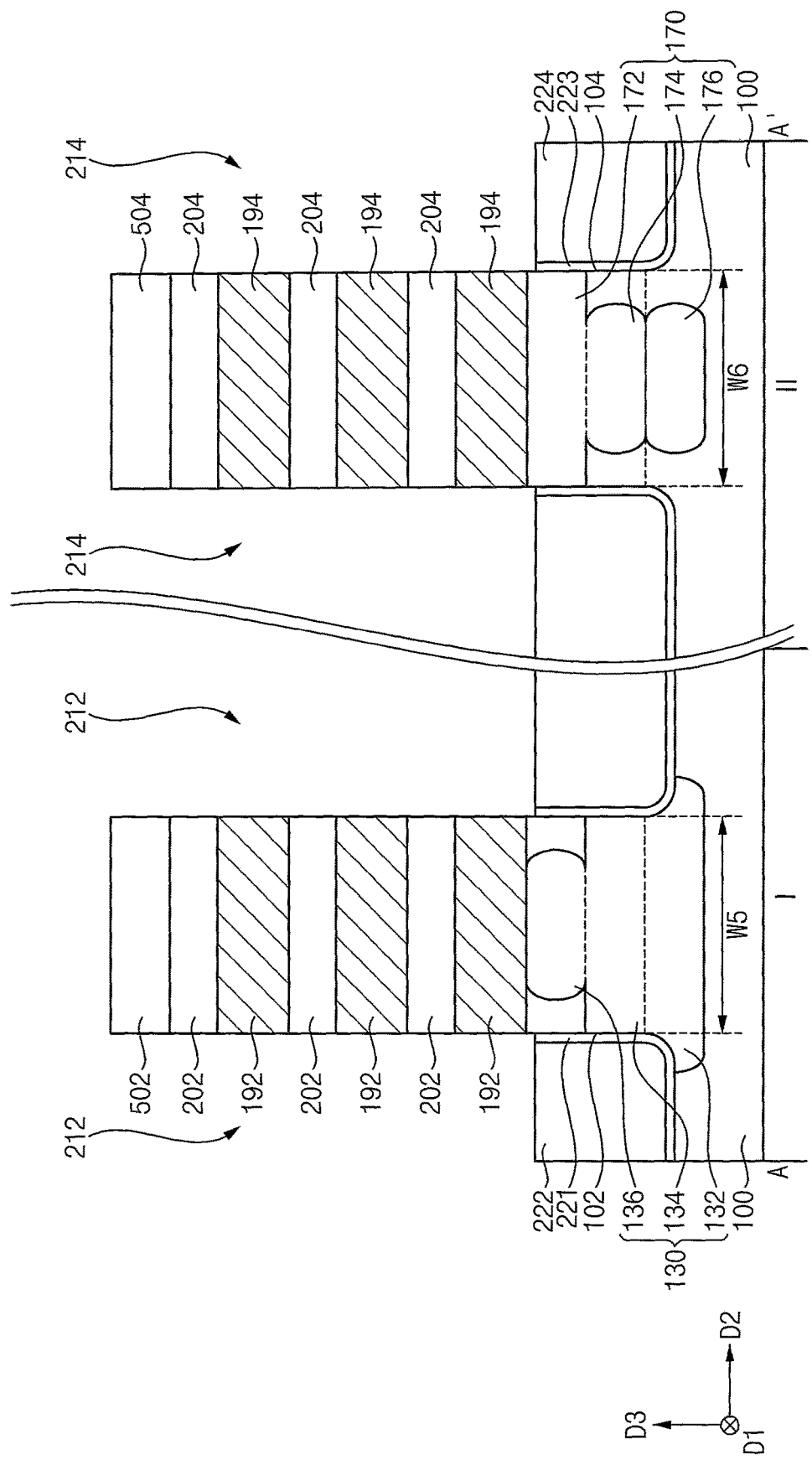

Referring to FIGS. 12 and 13, the etching mask layer 500 may be patterned to form first and second etching masks 502 and 504 on the first and second regions I and II, respectively, of the substrate 100, and the semiconductor layers 200, the sacrificial layers 190 and an upper portion of the substrate 100 may be etched using the first and second etching masks 502 and 504 to form first and second trenches 212 and 214 on the first and second regions I and II, respectively.

Thus, a first active pattern 102 may be formed to extend in the first direction D1 on the first region I of the substrate 100, and a first fin structure including first sacrificial lines 192 and first semiconductor lines 202 alternately and repeatedly stacked may be formed on the first active pattern 102. The first etching mask 502 may be formed on the first fin structure. Hereinafter, the first active pattern 102, the first fin structure and the first etching mask 502 sequentially stacked may be referred to as a first stack.

Additionally, a second active pattern 104 may be formed to extend in the first direction D1 on the second region II of the substrate 100, and a second fin structure including second sacrificial lines 194 and second semiconductor lines 204 alternately and repeatedly stacked may be formed on the second active pattern 104. The second etching mask 504 may be formed on the second fin structure. Hereinafter, the second active pattern 104, the second fin structure and the second etching mask 504 sequentially stacked may be referred to as a second stack.

In example embodiments, the first and second etching masks 502 and 504 may overlap the first and second wells 130 and 170, respectively, in the third direction D3. Thus, the first and second active patterns 102 and 104 may include at least portions of the first and second wells 130 and 170, respectively.

In example embodiments, the first and second trenches 212 and 214 may extend to a depth at which the first and sixth impurity regions 132 and 176 are formed, and thus lower surfaces of the first and second active patterns 102 and 104 that may be defined by the first and second trenches 212 and 214, respectively, may be lower than upper surfaces of the first and sixth impurity regions 132 and 176, respectively, and may be higher than lower surfaces of the first and sixth impurity regions 132 and 176, respectively.

However, the disclosure may not be limited thereto. In an example embodiment, the lower surfaces of the first and second active patterns 102 and 104 may be higher than the upper surfaces of the first and sixth impurity regions 132 and 176, respectively, and lower than upper surfaces of the second and fifth impurity regions 134 and 174, respectively. Alternatively, the lower surfaces of the first and second active patterns 102 and 104 may be lower than the lower surfaces of the first and sixth impurity regions 132 and 176, respectively.

In example embodiments, a fifth width W5 of the first active pattern 102 in the second direction D2 may be greater than the second width W2 of the third impurity region 136 and smaller than the first width W1 of the first and second impurity regions 132 and 134.

Thus, the third impurity region 136 may be formed at a central portion in the second direction D2 of an upper portion of the first active pattern 102, and may not be formed at opposite end portions in the second direction D2 of the upper portion of the first active pattern 102. The first and second impurity regions 132 and 134 may be formed entirely at middle and lower portions, respectively, of the first active pattern 102, and particularly, the lower surface of the first active pattern 102 may be entirely covered by the first impurity region 132 having a width greater than that of the lower surface of the first active pattern 102.

Additionally, a sixth width W6 of the second active pattern 104 in the second direction D2 may be greater than the fourth width W4 of the fifth and sixth impurity regions 174 and 176 and smaller than the third width W3 of the fourth impurity region 172.

Thus, the fourth impurity region 172 may be formed entirely at an upper portion of the second active pattern 104. The fifth and sixth impurity regions 174 and 176 may be formed at central portions in the second direction D2 of middle and lower portions, respectively, of the second active pattern 104, and the fifth and sixth impurity regions 174 and 176 may not be formed at opposite end portions in the second direction D2 of the middle and lower portions, respectively, of the second active pattern 104.

A liner layer may be formed on surfaces of the first and second stacks and the upper surface of the substrate 100, and an isolation layer may be formed on the liner layer to fill the first and second trenches 212 and 214.

The liner layer may be formed ono the first and second sacrificial lines 192 and 194 and the first and second semiconductor lines 202 and 204 included in the first and second stacks so that the first and second semiconductor lines 202 and 204 may be prevented from being oxidized.

The isolation layer may be planarized until portions of the liner layer on upper surfaces of the first and second stacks are exposed. In example embodiments, the planarization process may include a chemical mechanical polishing (CMP) process.

Upper portions of the liner layer and the isolation layer may be removed, and the first and second etching masks 502 and 504 may also be removed. Thus, a sidewall of each of the first and second fin structures may be exposed, and an upper sidewall of each of the first and second active patterns 102 and 104 may also be partially exposed.

As a result, the first active pattern 102, the first fin structure, a first liner 221 on the sidewall of the first active pattern 102 and the upper surface of the substrate 100, and a first isolation pattern 222 filling a lower portion of the first trench 212 on the first liner 221 may be formed on the first region I of the substrate 100. Additionally, the second active pattern 104, the second fin structure, a second liner 223 on the sidewall of the second active pattern 104 and the upper surface of the substrate 100, and a second isolation pattern 224 filling a lower portion of the second trench 214 on the second liner 223 may be formed on the second region II of the substrate 100.

Figure 14:
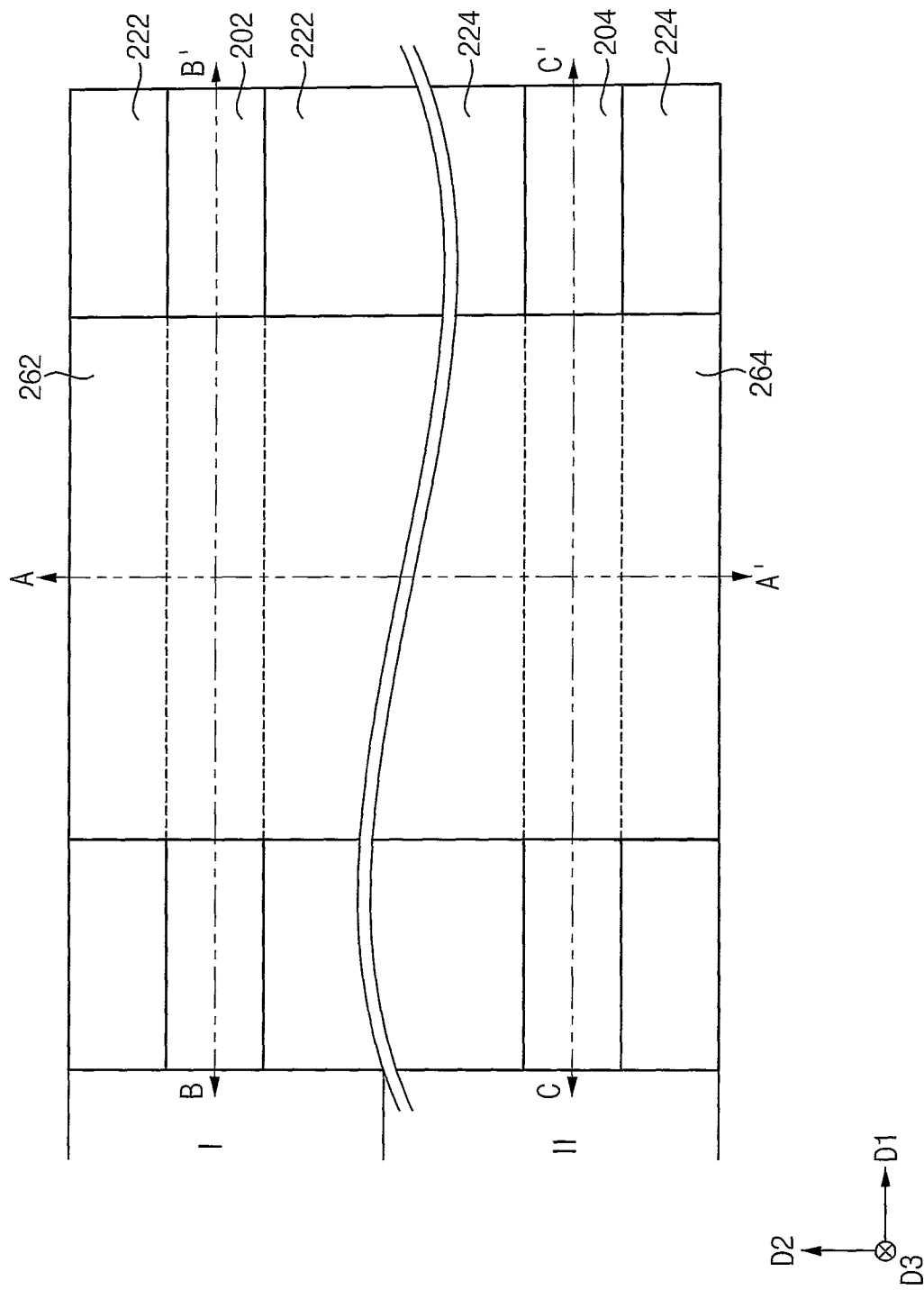
Figure 15:
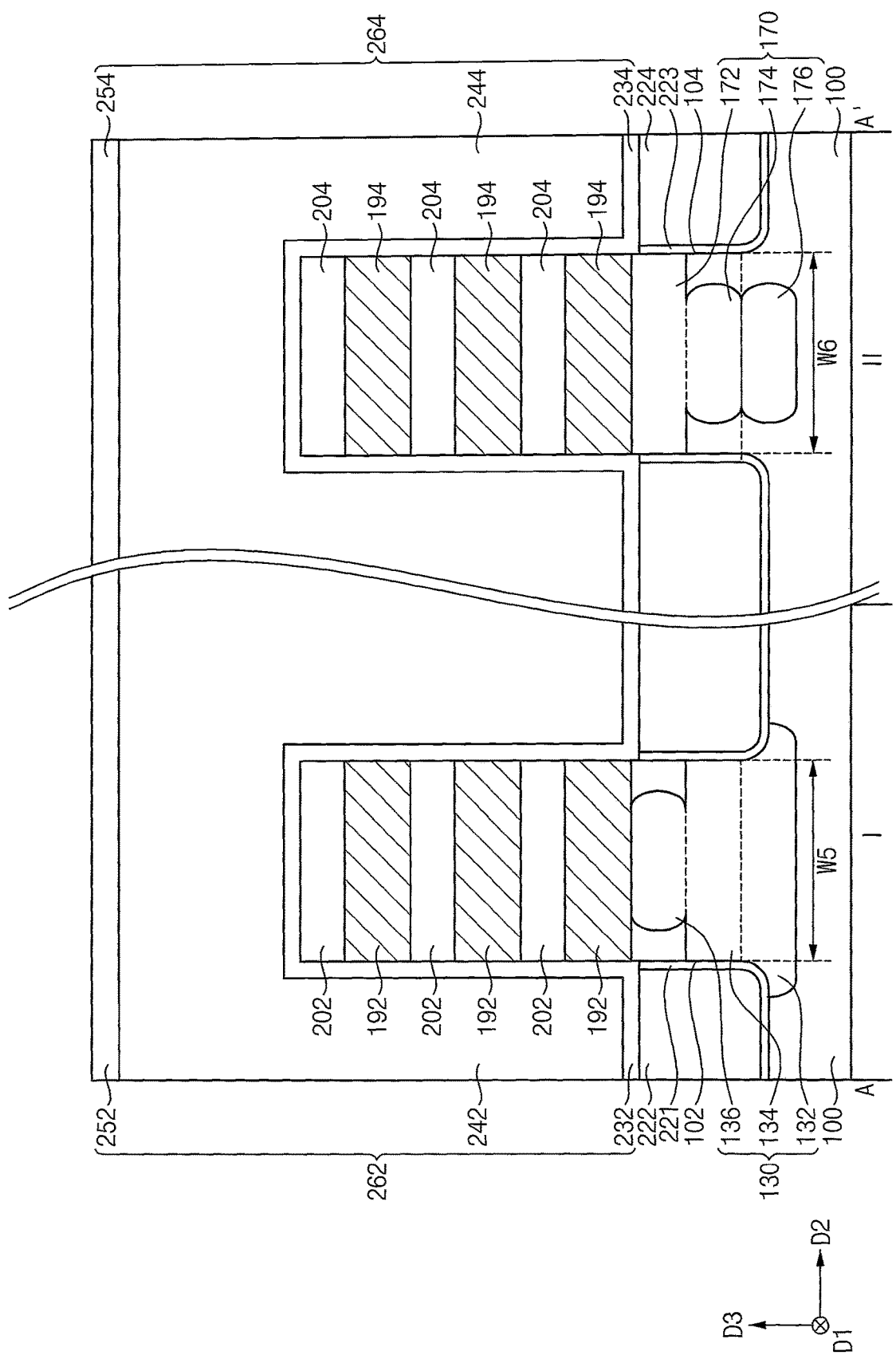
Figure 16:
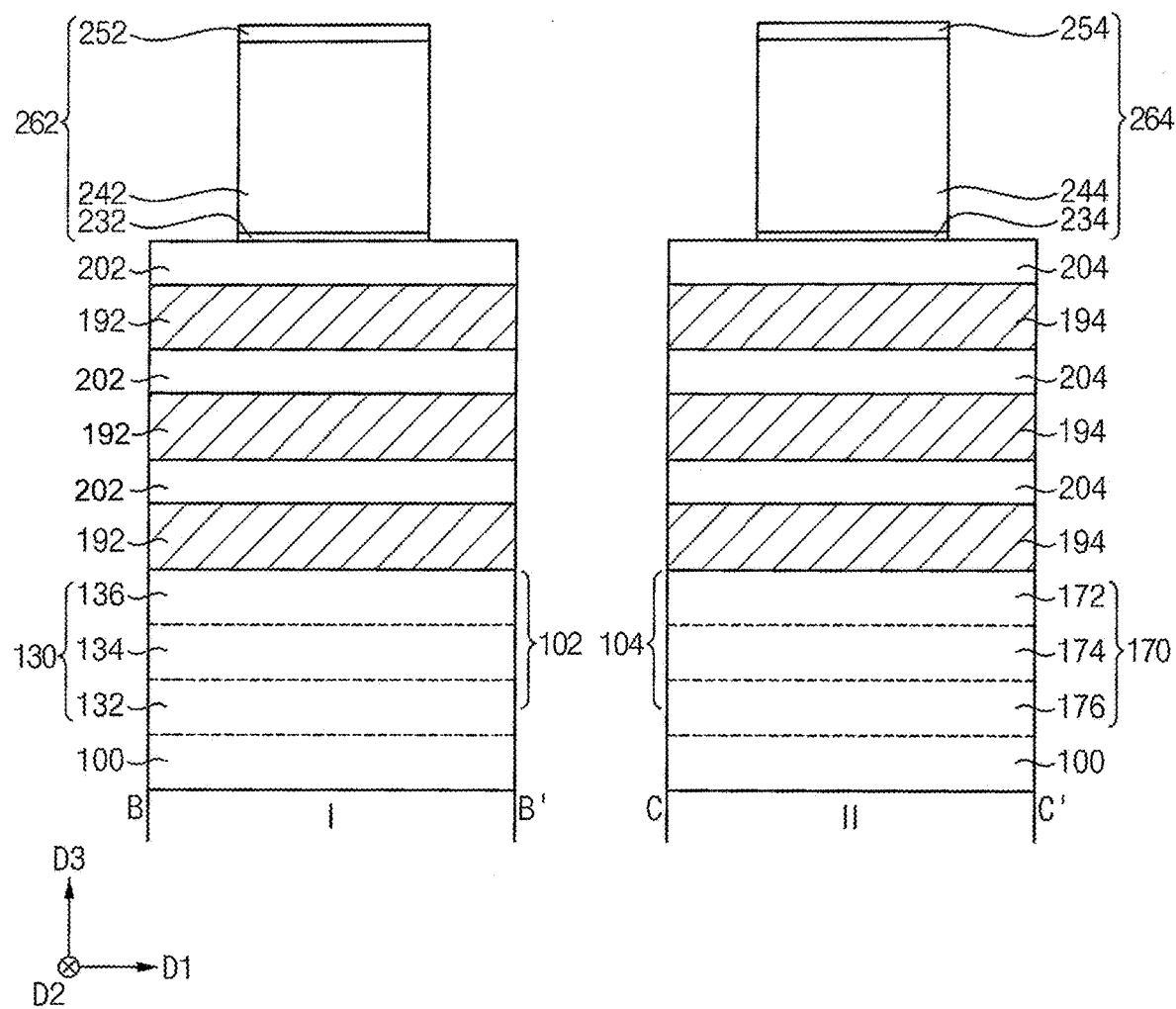

Referring to FIGS. 14 to 16, a first dummy gate structure 262 may be formed on the first isolation pattern 222 and the first liner 221 to partially surround the first fin structure, and a second dummy gate structure 264 may be formed on the second isolation pattern 222 and the second liner 223 to partially surround the second fin structure.

A dummy gate insulation layer, a dummy gate electrode layer and a dummy gate mask layer may be sequentially formed on the first and second fin structures, the first and second isolation patterns 222 and 224, and the first and second liners 221 and 223, and first photoresist patterns each of which may extend in the second direction D2 on the dummy gate mask layer may be formed on the first and second regions I and II of the substrate. Further, the dummy gate mask layer may be etched using the first photoresist patterns as an etching mask to form first and second dummy gate masks 252 and 254 on the first and second regions I and II, respectively, of the substrate 100.

The dummy gate insulation layer may include an oxide, e.g., silicon oxide. The dummy gate electrode layer may include, e.g., polysilicon. The dummy gate mask layer may include a nitride, e.g., silicon nitride.

The dummy gate electrode layer and the dummy gate insulation layer may be etched using the first and second dummy gate masks 252 and 254 as an etching mask to form a first dummy gate electrode 242 and a first dummy gate insulation pattern 232, respectively, on the first region I of the substrate 100 and a second dummy gate electrode 244 and a second dummy gate insulation pattern 234, respectively, on the second region II of the substrate 100.

The first dummy gate insulation pattern 232, the first dummy gate electrode 242 and the first dummy gate mask 252 sequentially stacked on the first fin structure and a portion of the first isolation pattern 222 adjacent thereto in the second direction D2 may collectively form a first dummy gate structure 262, and the second dummy gate insulation pattern 234, the second dummy gate electrode 244 and the second dummy gate mask 254 sequentially stacked on the second fin structure and a portion of the second isolation pattern 224 adjacent thereto in the second direction D2 may collectively form a second dummy gate structure 264.

In example embodiments, the first dummy gate structure 262 may extend in the second direction D2 on the first fin structure and the first isolation pattern 222, and may be formed on an upper surface of the first fin structure and opposite sidewalls in the second direction D2. The first dummy gate structure 262 may partially surround an upper sidewall of the first active pattern 102.

Additionally, the second dummy gate structure 264 may extend in the second direction D2 on the second fin structure and the second isolation pattern 224, and may be formed on an upper surface of the second fin structure and opposite sidewalls in the second direction D2. The second dummy gate structure 264 may partially surround an upper sidewall of the second active pattern 104.

Figure 17:
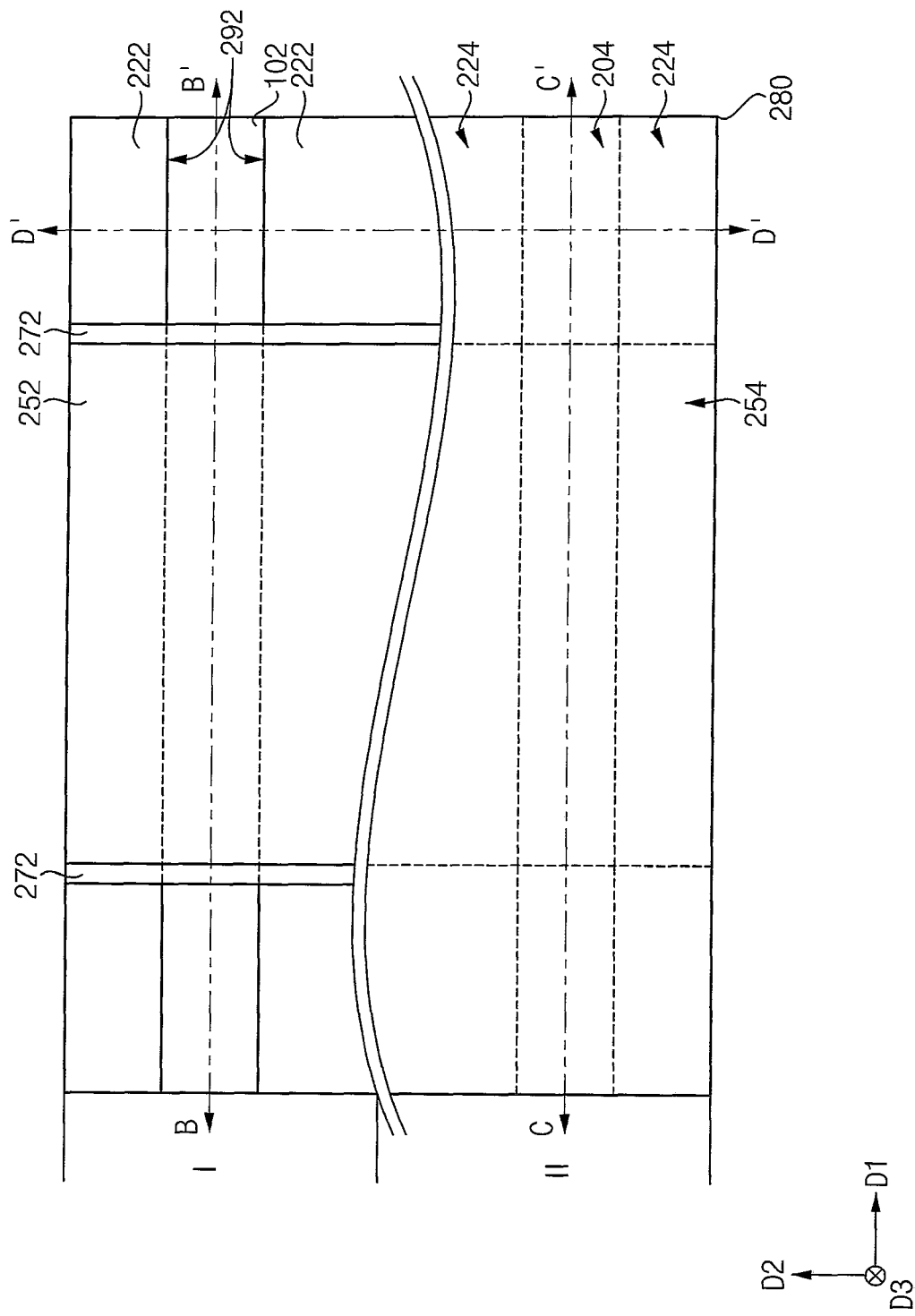
Figure 18:
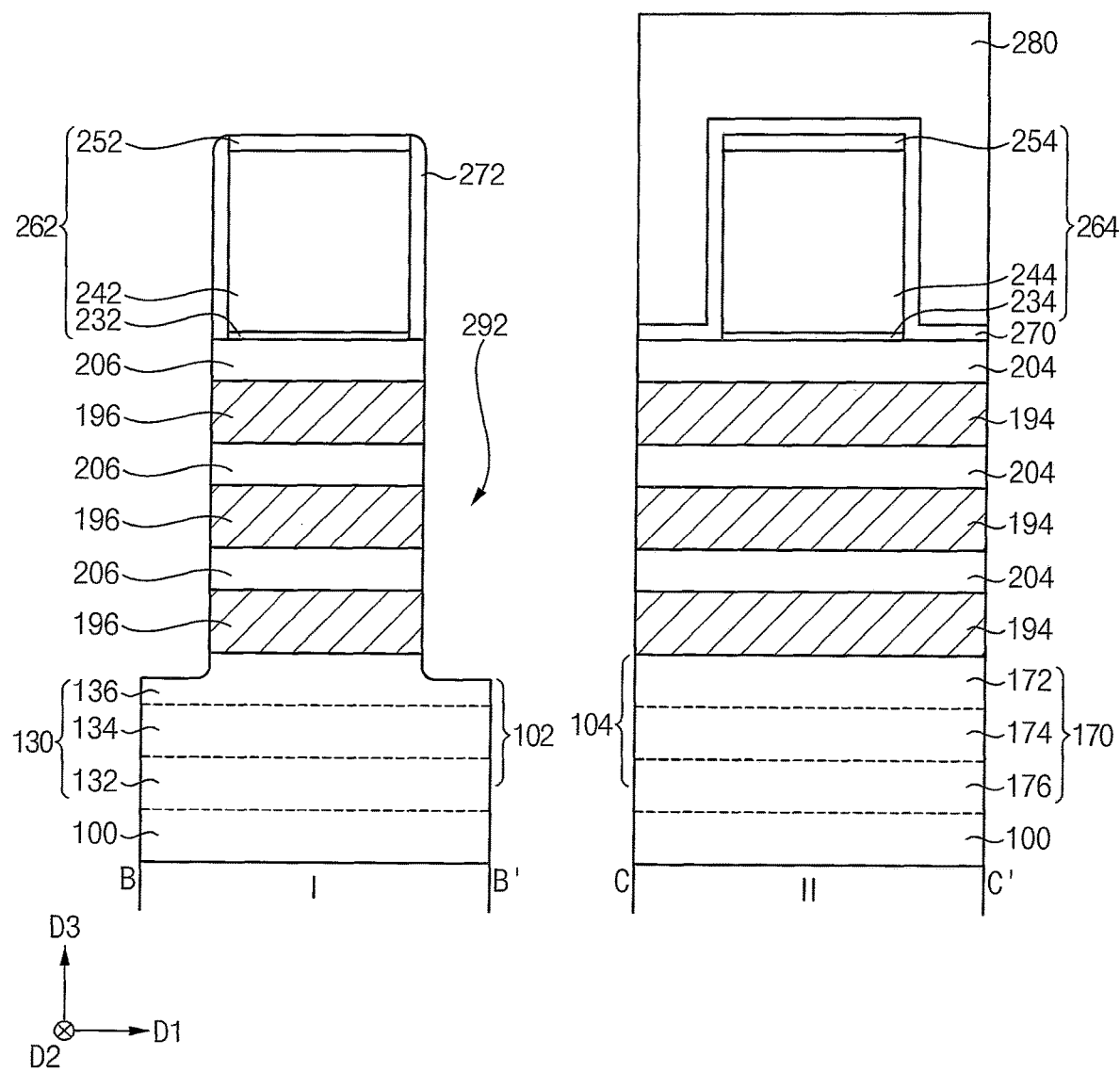
Figure 19:
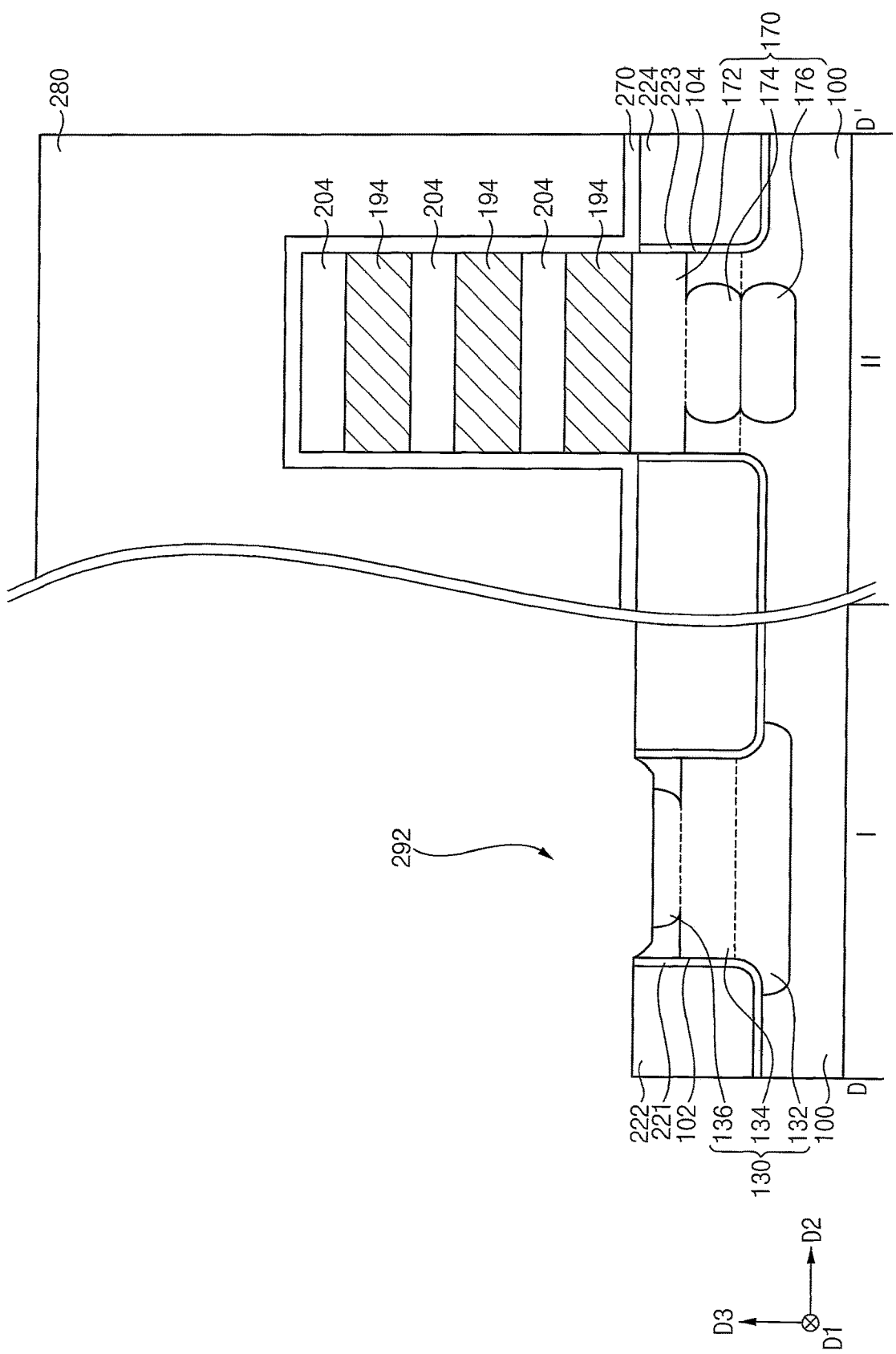

Referring to FIGS. 17 to 19, a first spacer layer 270 may be formed on the substrate 100 having the first and second fin structures, the first and second isolation patterns 222 and 224, the first and second liners 221 and 223, and the first and second dummy gate structures 262 and 264 thereon, and a second photoresist pattern 280 may be formed on the first spacer layer 270 in the second region II of the substrate 100. A portion of the first spacer layer 270 in the first region I of the substrate 100 may be removed by an etching process.

Thus, a first gate spacer 272 on each of opposite sidewalls in the first direction D1 of the first dummy gate structure 262 may be formed.

The first fin structure may be etched using the first dummy gate structure 262 and the first gate spacer 272 as an etching mask to form a first recess 292 exposing an upper surface of the first active pattern 102.

Thus, the first sacrificial lines 192 and the first semiconductor lines 202 under the first dummy gate structure 262 and the first gate spacer 272 may be transformed into first sacrificial patterns 196 and first semiconductor patterns 206, respectively, and the first fin structure extending in the first direction D1 may be divided into a plurality of parts spaced apart from each other in the first direction D1.

Hereinafter, the first dummy gate structure 262, the first gate spacers 272 on opposite sidewalls of the first dummy gate structure 262 and the first fin structure may be referred to as a third stack. In example embodiments, the third stack may extend in the second direction D2, and a plurality of third stacks may be spaced apart from each other in the first direction D1.

Figure 20:
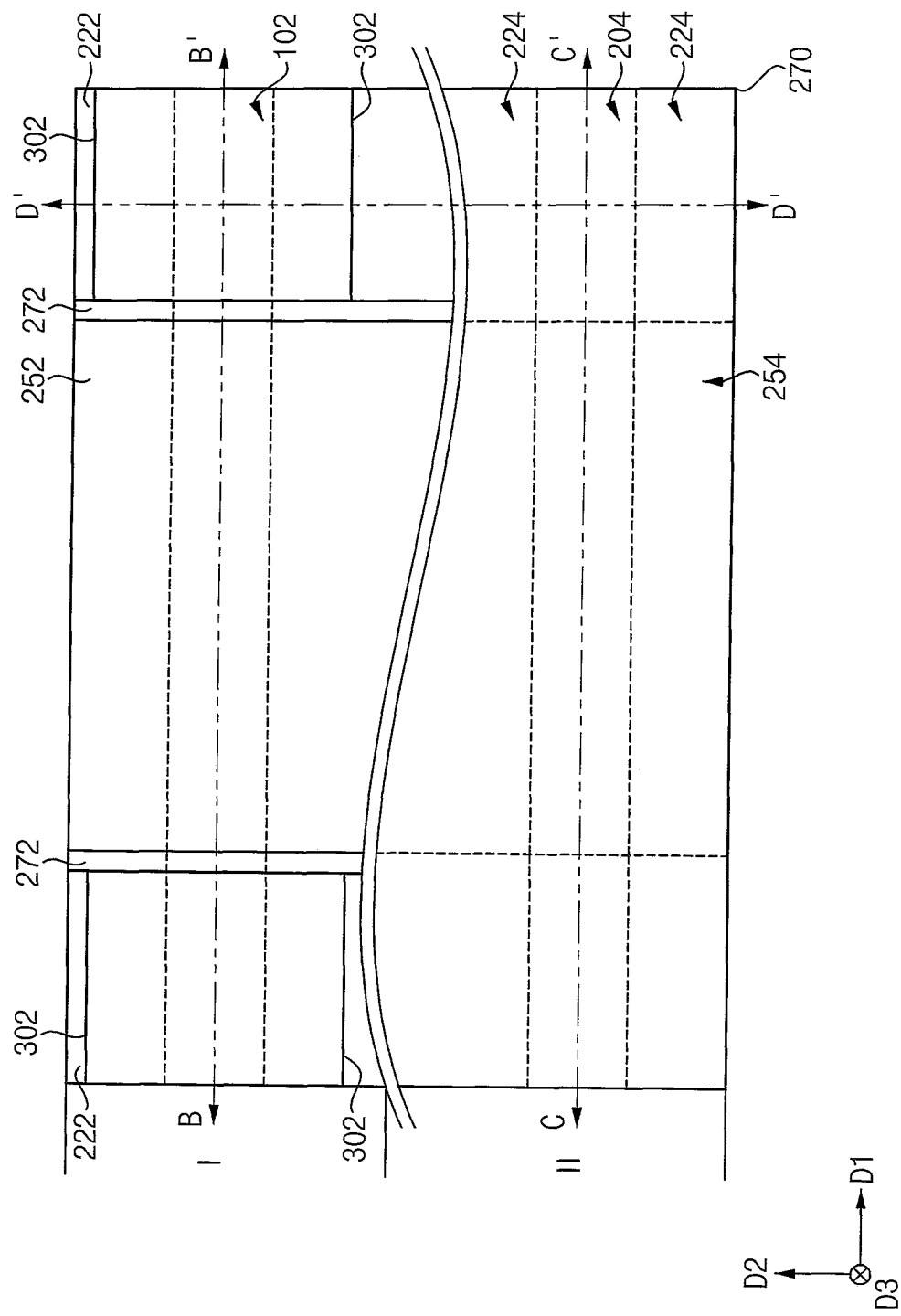
Figure 21:
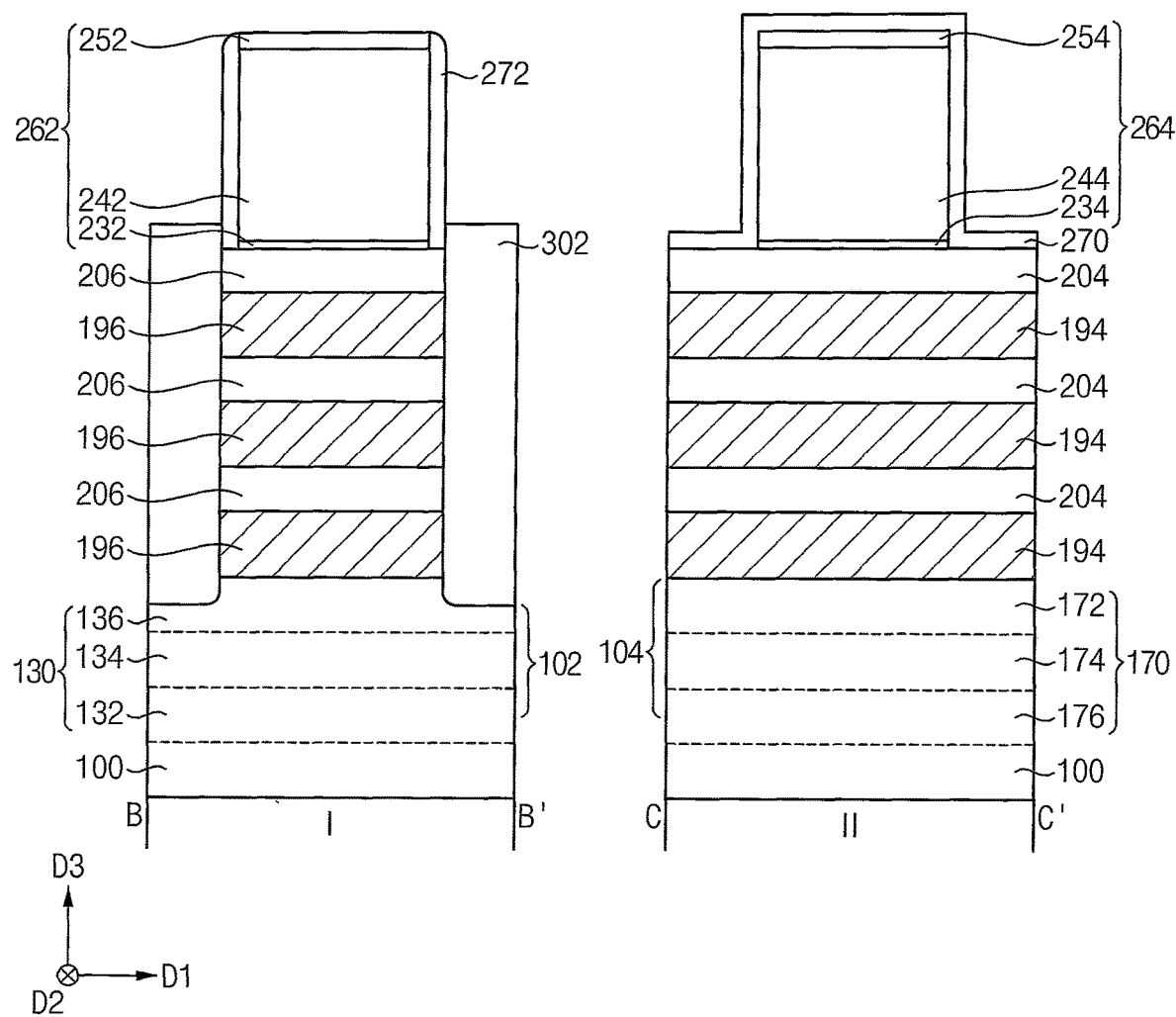
Figure 22:
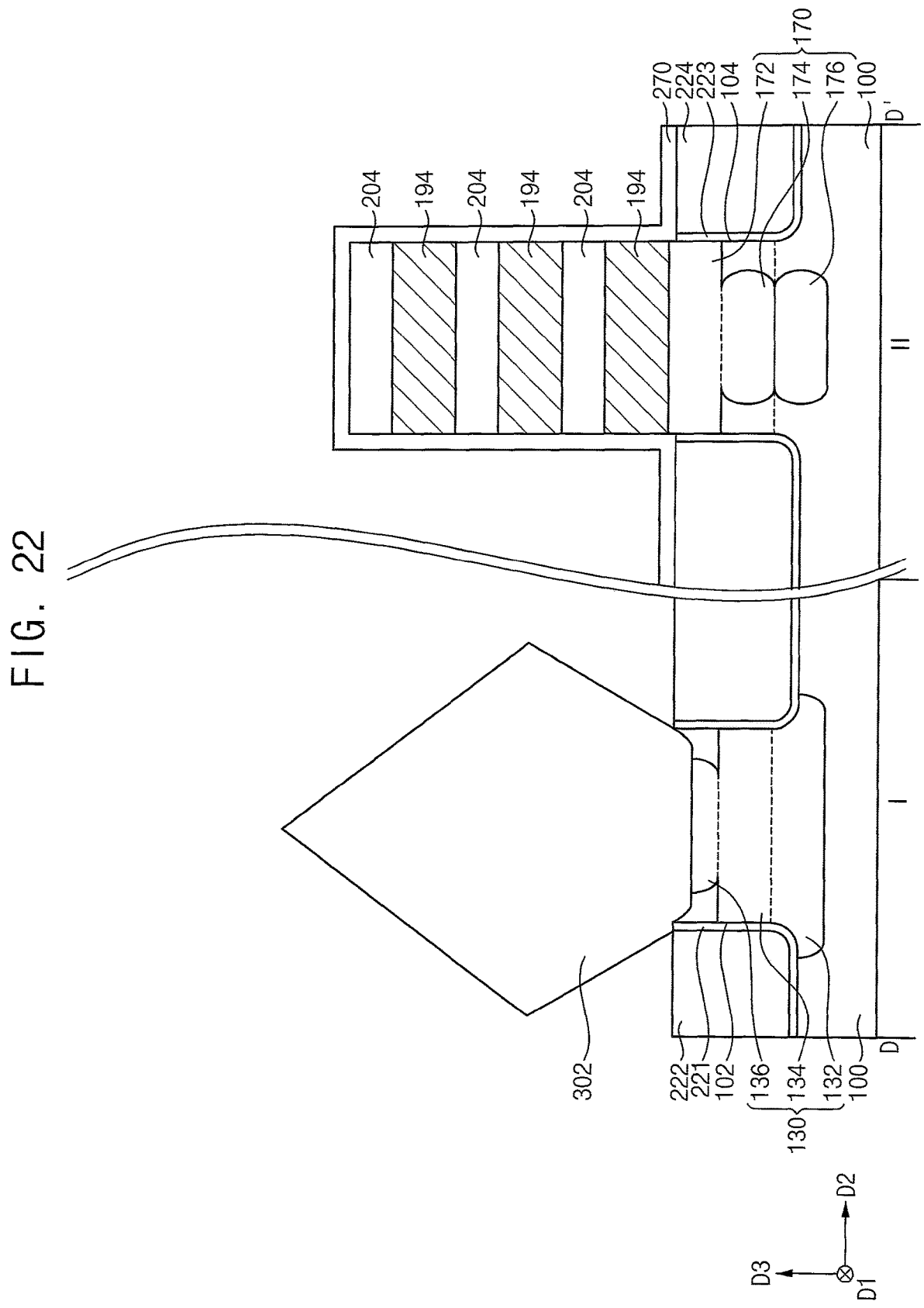

Referring to FIGS. 20 to 22, after removing the second photoresist pattern 280, a first source/drain layer 302 may be formed on the upper surface of the first active pattern 102 exposed by the first recess 292.

In example embodiments, the first source/drain layer 302 may be formed by a selective epitaxial growth (SEG) process using the exposed upper surface of the first active pattern 102 and sidewalls of the first sacrificial patterns 196 and the first semiconductor patterns 206 as a seed.

In example embodiments, the SEG process may be performed using a silicon source gas, e.g., dichlorosilane ($SiH_2Cl_2$) gas and a germanium source/drain gas, e.g., germanium tetrahydride ($GeH_4$) gas, and thus a single crystal silicon-germanium (SiGe) layer may be formed. One or more p-type impurities may be doped into the single crystalline SiGe layer and a heat treatment may be further performed. Thus, a single crystal SiGe layer doped with one or more p-type impurities may be formed, and may serve as a source/drain of a PMOS transistor.

In an example embodiment, the first source/drain layer 302 may be formed at each of opposite sides in the first direction D1 of the third stack, and may contact sidewalls of the first sacrificial patterns 196 and the first semiconductor patterns 206 and a portion of an outer sidewall of the first gate spacer 272.

In an example embodiment a cross-section of the first source/drain layer 302 in the second direction D2 may have a shape of, e.g., a pentagon or a hexagon, however, the disclosure may not be limited thereto.

Figure 23:
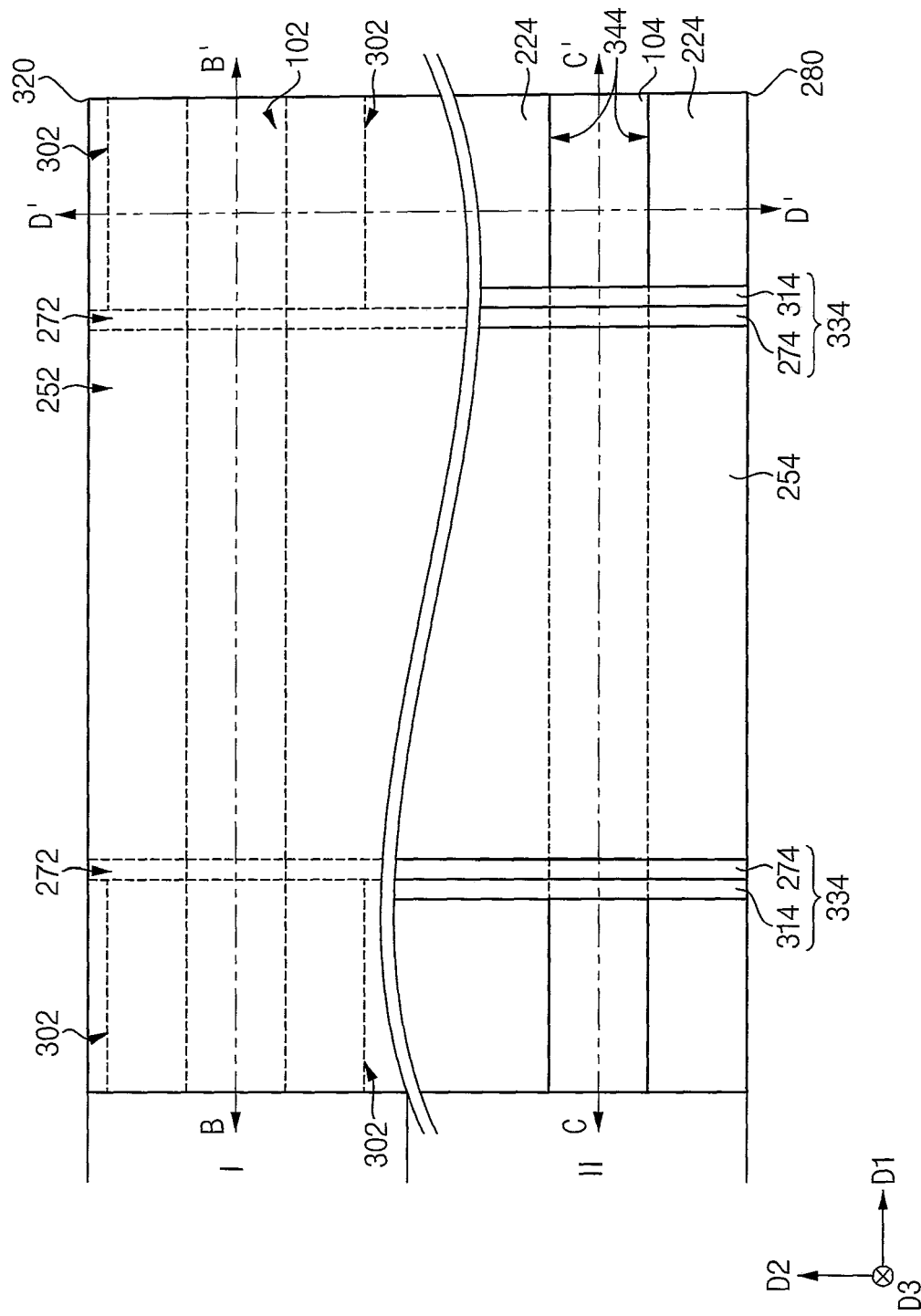
Figure 24:
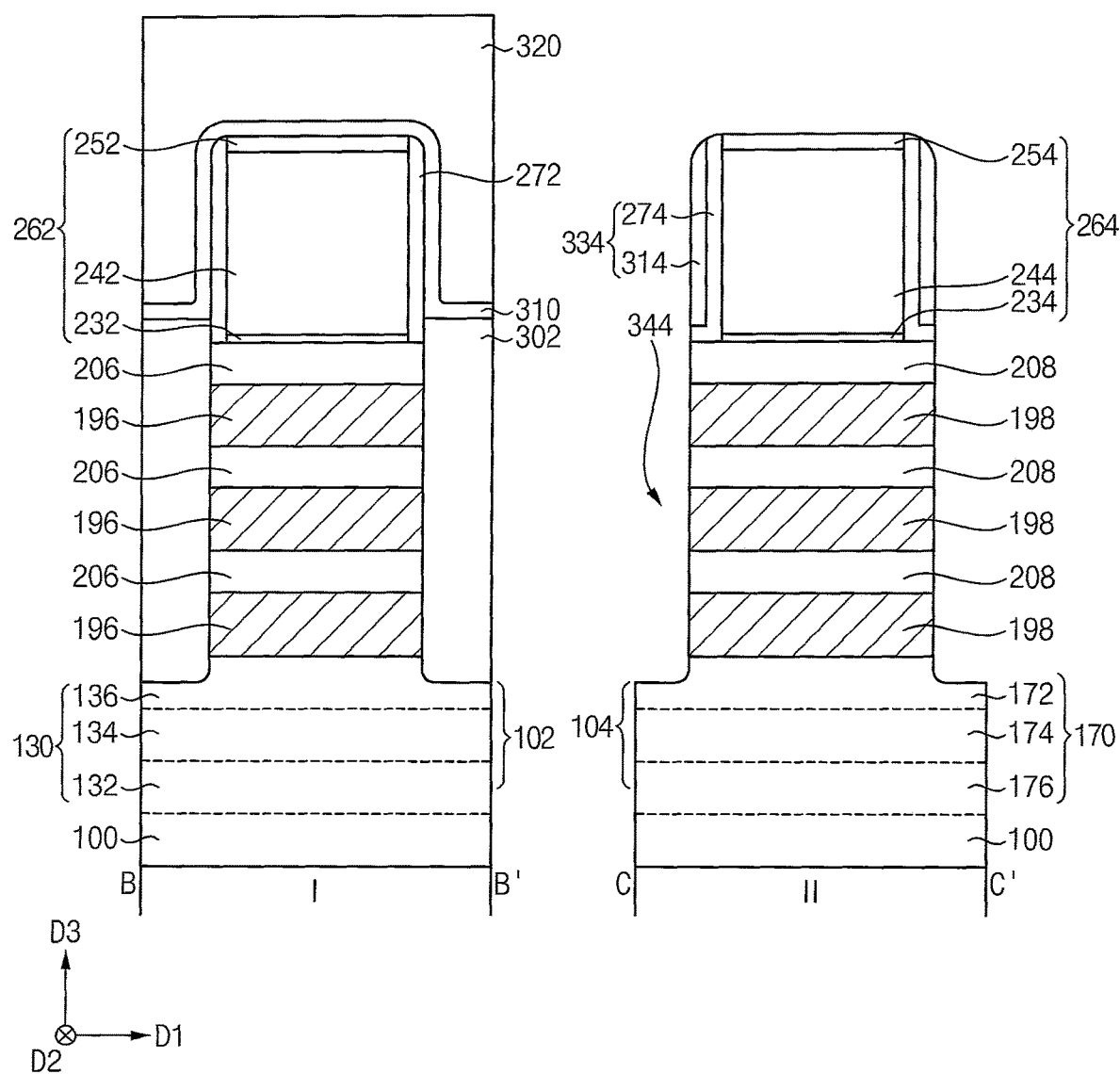
Figure 25:
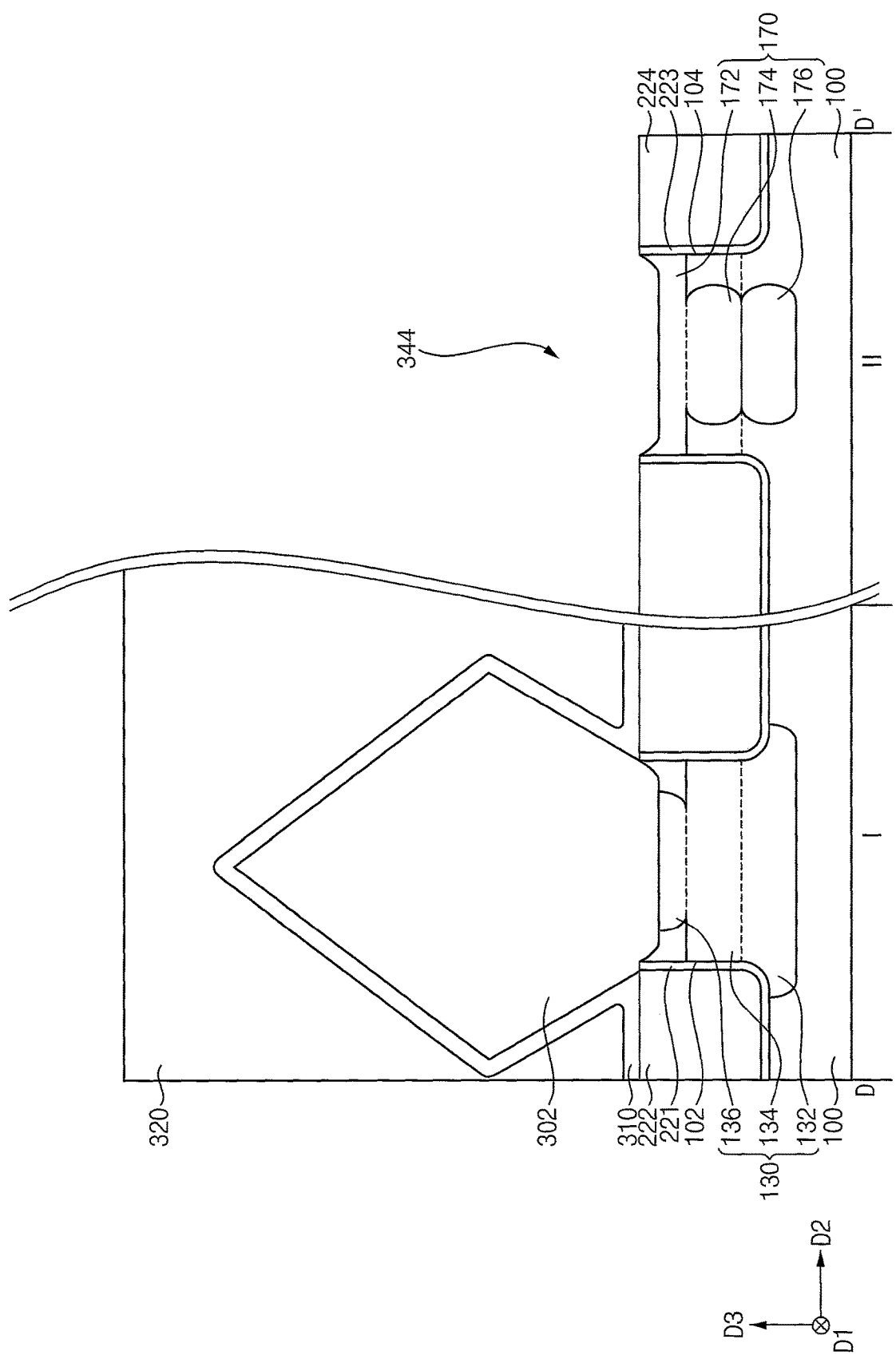

Referring to FIGS. 23 to 25, a second spacer layer 310 may be formed on the third stack, the first source/drain layer 302 and the first spacer layer 270, and a third photoresist pattern 320 may be formed on the second spacer 310 in the first region I of the substrate 100. Further, a portion of the second spacer layer 310 in the second region II of the substrate 100 may be anisotropically etched.

Thus, a fourth gate spacer 314 on portions of the first spacer layer 270 on opposite sidewalls in the first direction D1 of the second dummy gate structure 264 may be formed.

The first spacer layer 270 may be anisotropically etched to form a third gate spacer 274 on the opposite sidewalls in the first direction D1 of the second dummy gate structure 264. During the anisotropic etching process, a portion of the first spacer layer 270 under the fourth gate spacer 314 may remain, and thus the third gate spacer 274 may have a cross-section in the first direction D1 having a shape of an "L." The third and fourth gate spacers 274 and 314 may form a second gate spacer structure 334.

The second fin structure may be etched using the second dummy gate structure 264 and the second gate spacer structure 334 as an etching mask to form a second recess 344 exposing an upper surface of the second active pattern 104.

Thus, the second sacrificial lines 194 and the second semiconductor lines 204 under the second dummy gate structure 264 and the second gate spacer structure 334 may be transformed into second sacrificial patterns 198 and second semiconductor patterns 208, respectively, and the second fin structure extending in the first direction D1 may be divided into a plurality of fin structures spaced apart from each other in the first direction D1.

Hereinafter, the second dummy gate structure 264, the second gate spacer structures 334 on opposite sidewalls of the second dummy gate structure 264, and the second fin structure may be collectively referred to as a fourth stack. In example embodiments, the fourth stack may extend in the second direction D2, and a plurality of fourth stacks may be spaced apart from each other in the first direction D1.

Figure 26:
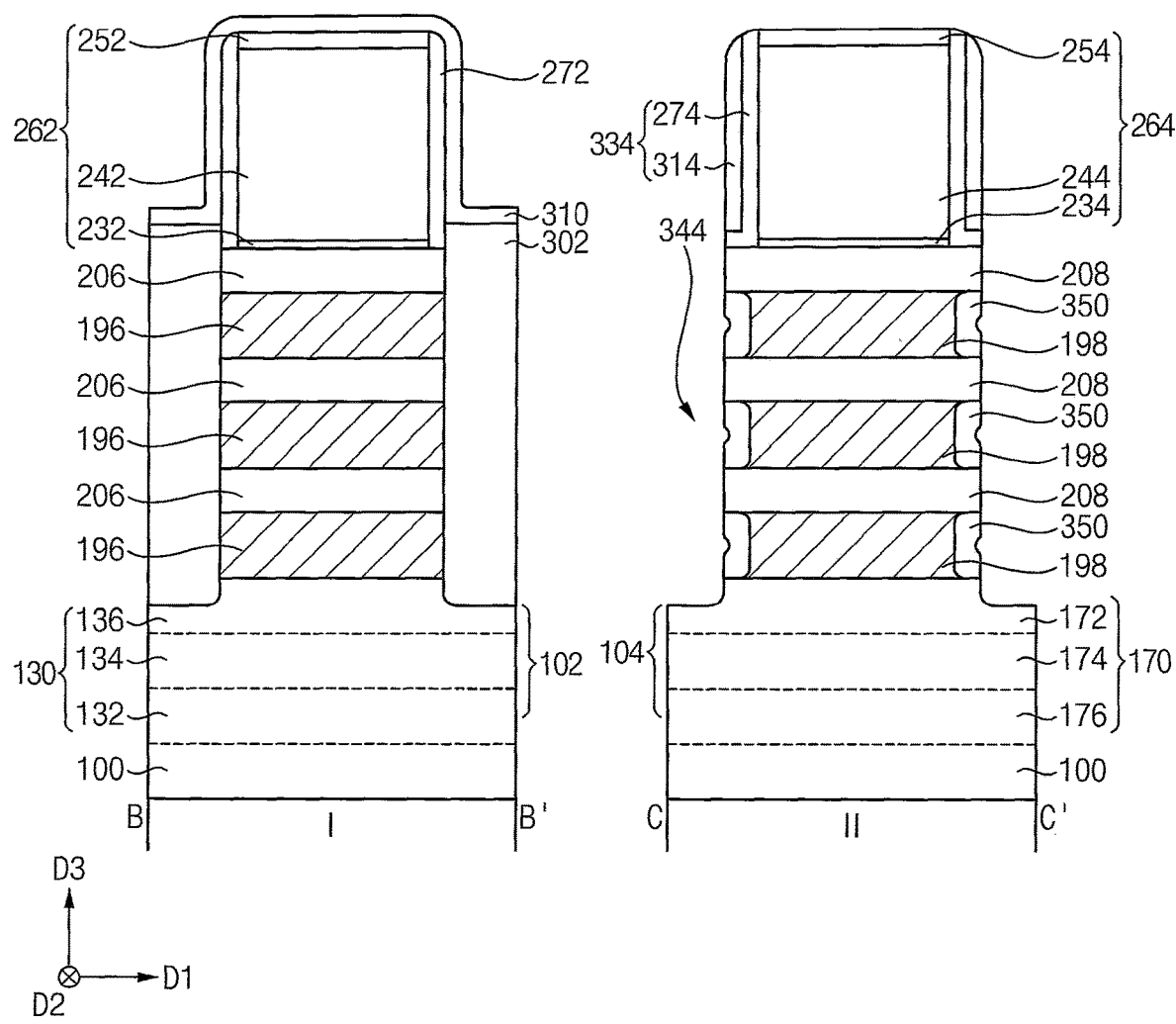

Referring to FIG. 26, after removing the third photoresist pattern 320, each of opposite sidewalls in the first direction D1 of the second sacrificial patterns 198 exposed by the second recess 344 may be etched to form a third recess.

In example embodiments, the third recess may be formed by a wet etching process on the second sacrificial patterns 198.

An inner spacer 350 may be formed to fill the third recess. In example embodiments, the inner spacer 350 may be formed by forming a third spacer layer on the substrate 100 to fill the third recess and anisotropically etching the third spacer layer.

Thus, the inner spacer 350 may be formed on each of opposite sidewalls in the first direction D1 of each of the second sacrificial patterns 198. In an example embodiment, a cross-section of the inner spacer 350 in the first direction D1 may have a shape of a horseshoe or a semi-circle with a recess on a sidewall.

Figure 27:
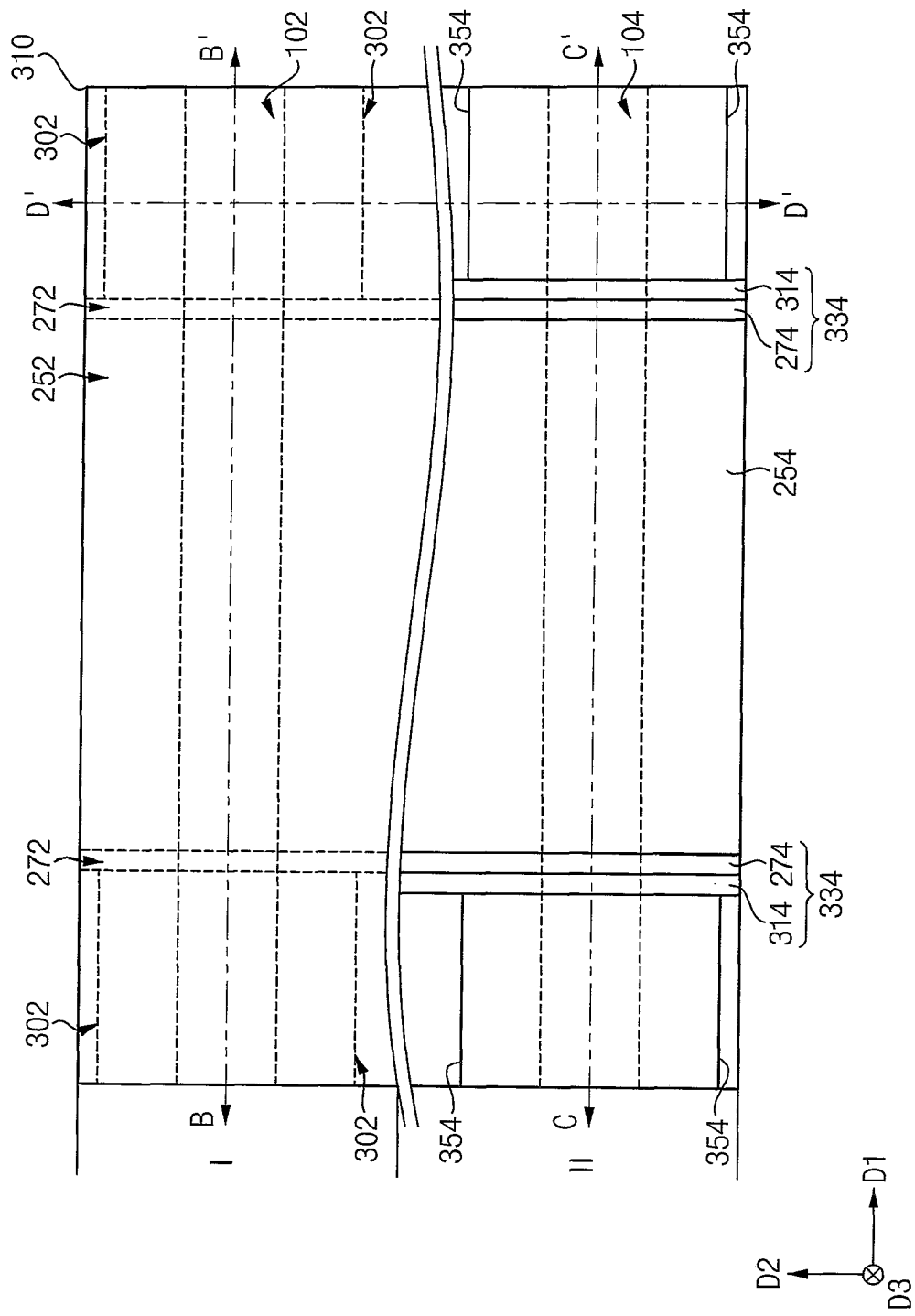
Figure 28:
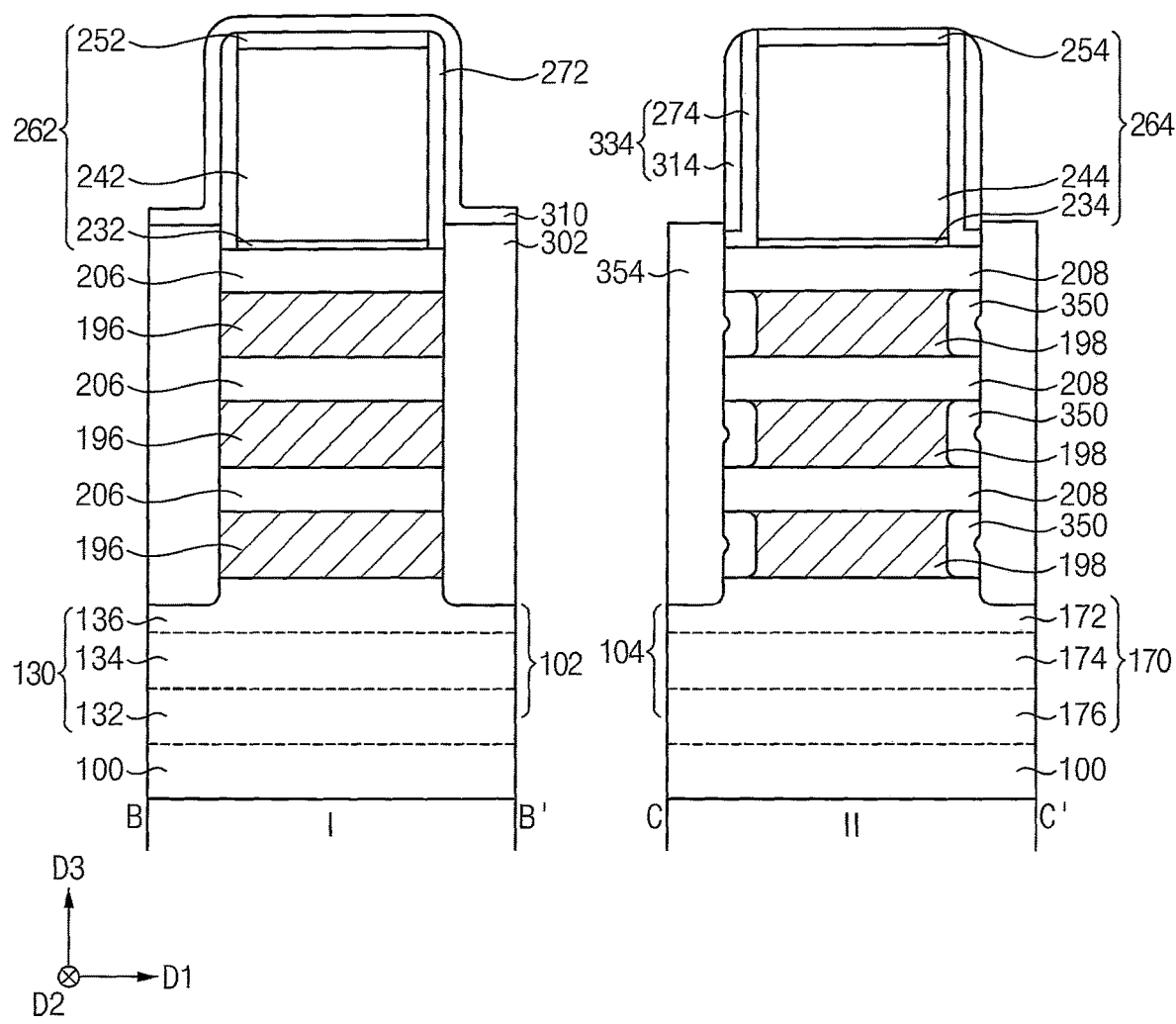
Figure 29:
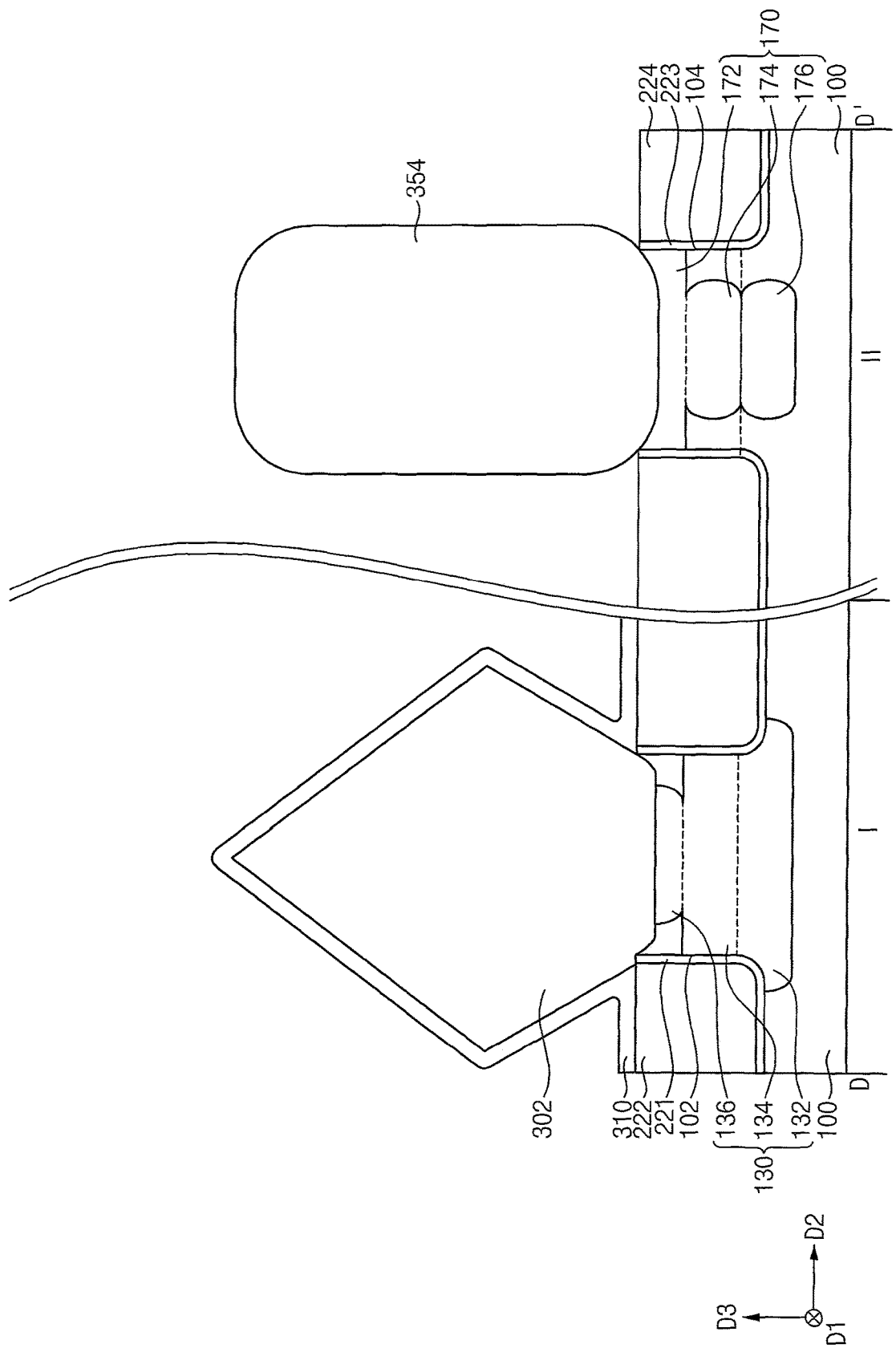

Referring to FIGS. 27 to 29, a second source/drain layer 354 may be formed on the upper surface of the second active pattern 104 exposed by the second recess 344.

In example embodiments, the second source/drain layer 354 may be formed by an SEG process using the upper surface of the second active pattern 104 and the sidewalls of the second sacrificial patterns 198 and the second semiconductor patterns 208 as a seed.

In example embodiments, the SEG process may be performed using a silicon source gas, e.g., disilane ($Si_2H_6$) gas, and thus a single crystalline silicon layer may be formed. Alternatively, the SEG process may be performed using a silicon source gas, e.g., disilane ($Si_2H_6$) gas and a carbon source gas, e.g., methylsilane ($SiH_3CH_3$) gas, and thus a single crystal silicon carbide (SiC) layer may be formed. One or more n-type impurities may be doped into the single crystalline silicon layer or the SiC layer and a heat treatment may be further performed. Thus, a single crystal silicon layer doped with one or more n-type impurities or a single crystal SiC layer doped with one or more n-type impurities may be formed, and may serve as a source/drain of an NMOS transistor.

In example embodiments, the second source/drain layer 354 may be formed at each of opposite sides in the first direction D1 of the fourth stack, and may contact sidewalls of the second sacrificial patterns 198 and the second semiconductor patterns 208 and a portion of an outer sidewall of the second gate spacer structure 344.

In an example embodiment, the second source/drain layer 354 may have a cross-section in the second direction D2 having a shape of a rectangle with rounded corners, however, the disclosure may not be limited thereto.

Figure 30:
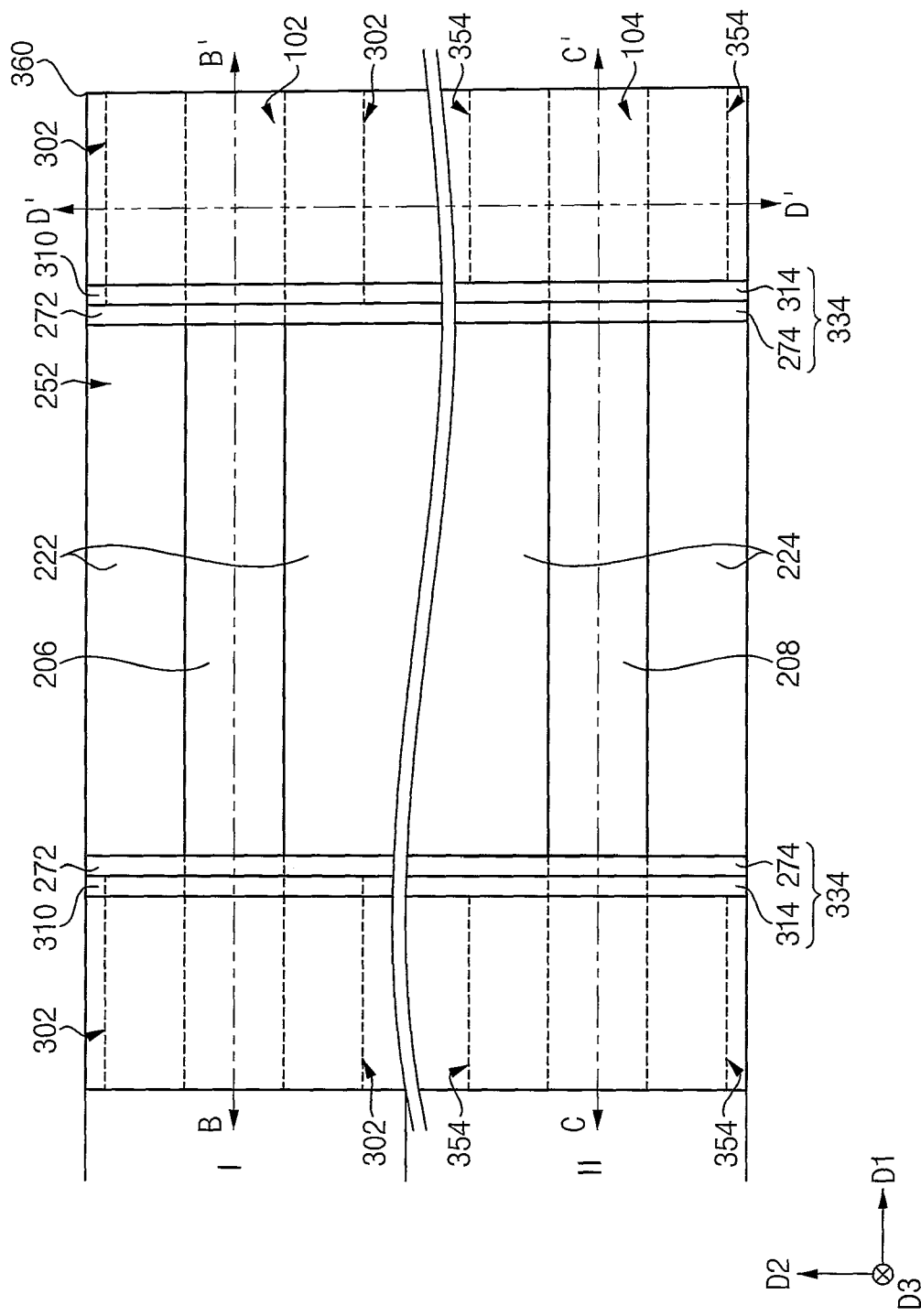
Figure 31:
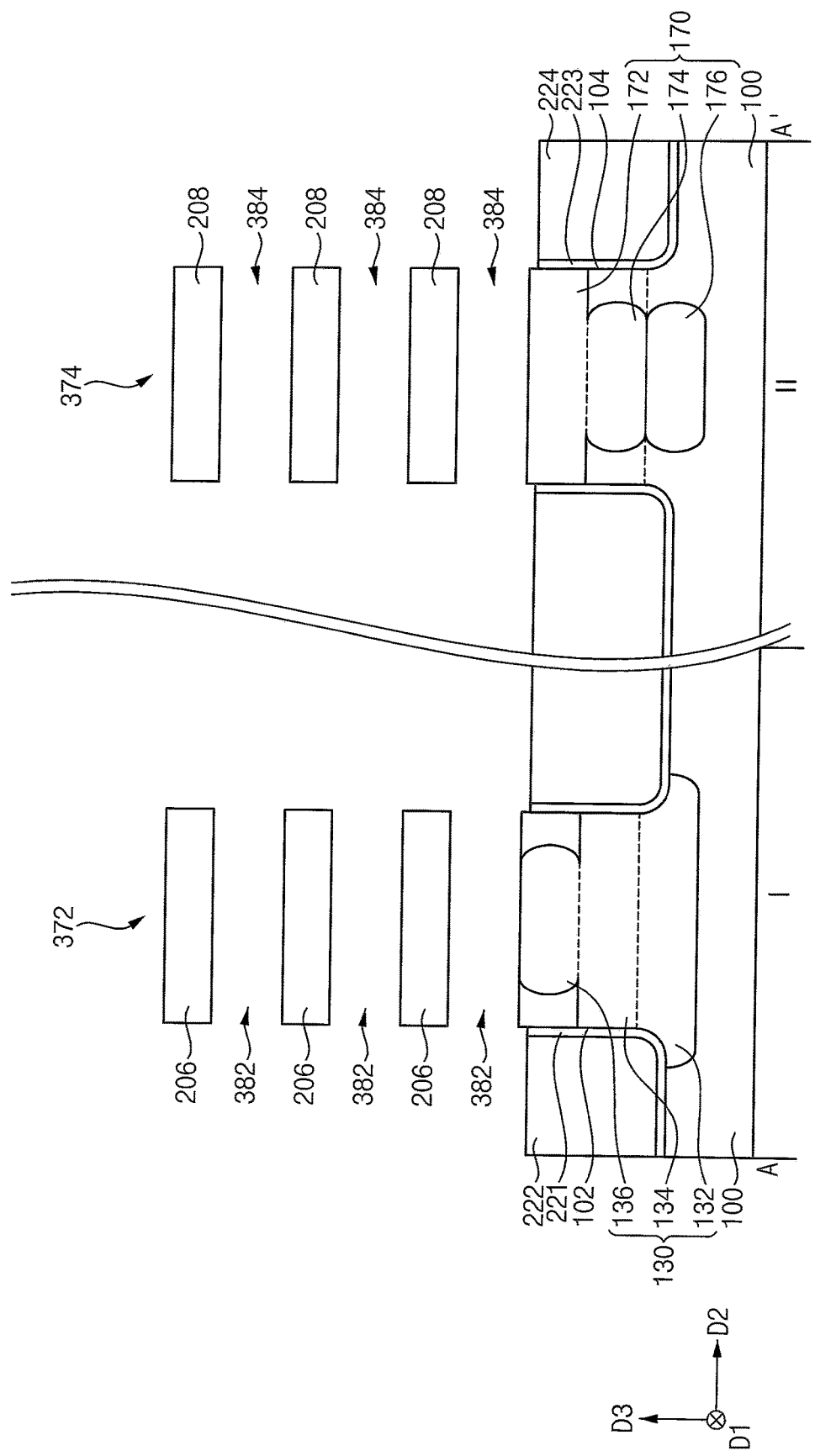
Figure 32:
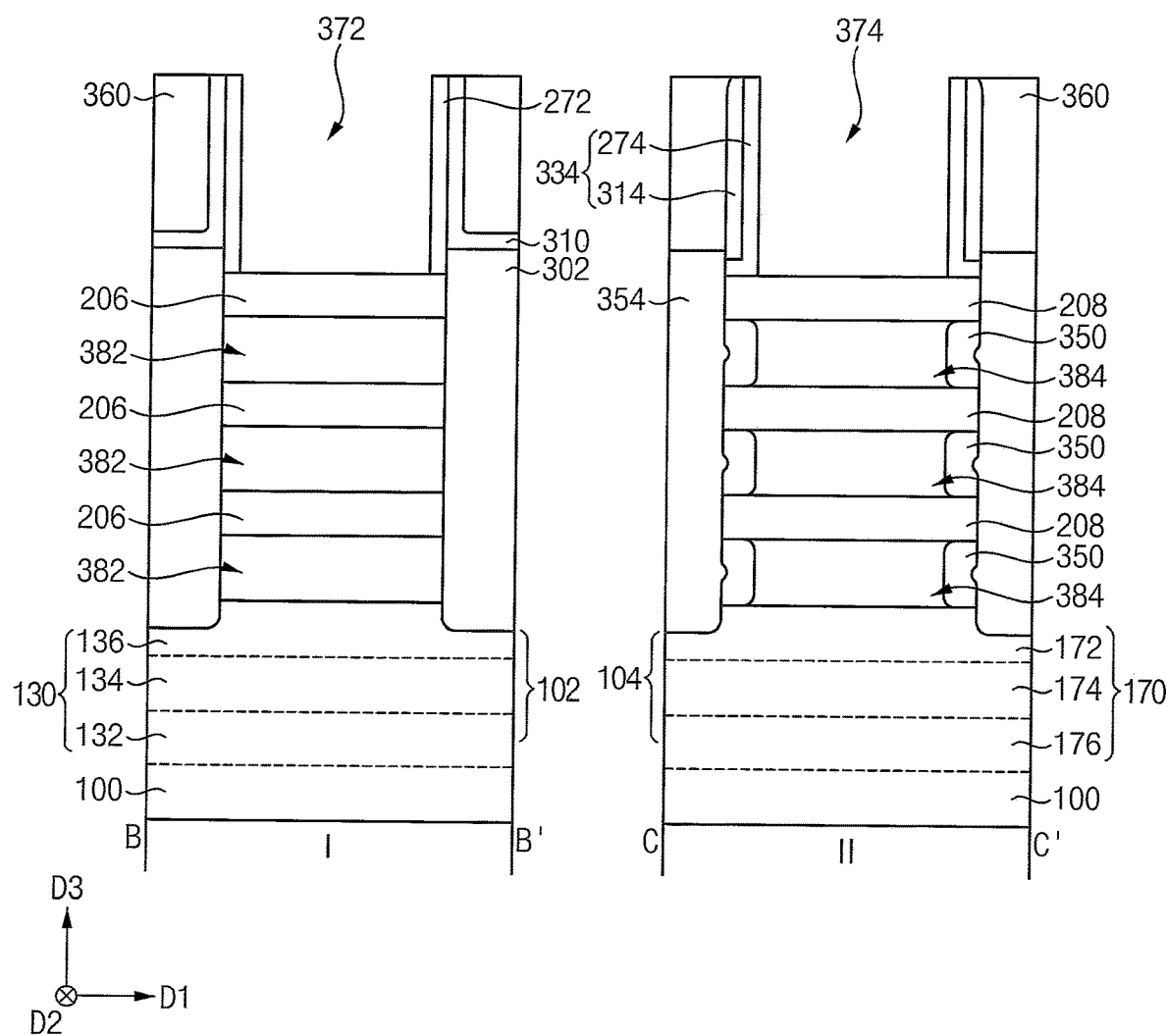

Referring to FIGS. 30 to 32, an insulation layer 360 may be formed on the third and fourth stacks, the second spacer layer 310, the first and second source/drain layers 302 and 354 and the second isolation pattern 224, and may be planarized until upper surfaces of the first and second dummy gate electrodes 242 and 244 included in the third and fourth stacks, respectively, are exposed. The planarization process may include a CMP process and/or an etch back process.

During the planarization process, the first and second dummy gate masks 252 and 254 may also be removed, and upper portions of the first gate spacer 272, the second spacer layer 310 and the second gate spacer structure 334 may also be partially removed.

The first and second dummy gate electrodes 242 and 244 and the first and second dummy gate insulation patterns 232 and 234 may be removed to form third and fourth openings 372 and 374 exposing upper surfaces of the uppermost first and second semiconductor patterns 206 and 208, respectively. The first and second dummy gate electrodes 242 and 244 and the first and second dummy gate insulation patterns 232 and 234 may be removed by, e.g., a wet etching process.

The first sacrificial patterns 196 may be removed to form a fifth opening 382 exposing surfaces of the first semiconductor patterns 206 and the upper surface of the first active pattern 102, and the second sacrificial patterns 198 may be removed to form a sixth opening 384 exposing inner sidewalls of the inner spacers 350, surfaces of the second semiconductor patterns 208 and the upper surface of the second active pattern 104.

Referring to FIGS. 1 to 4 again, a first gate structure 412 may be formed on the first region I of the substrate 100 to fill the third and fifth openings 372 and 382, and a second gate structure 414 may be formed on the second region II of the substrate 100 to fill the fourth and sixth openings 374 and 384.

Particularly, a thermal oxidation process may be performed on the upper surfaces of the first and second active patterns 102 and 104 and the surfaces of the first and second semiconductor patterns 206 and 208 exposed by the third to sixth openings 372, 374, 382 and 384 to form first and second interface patterns, a gate insulation layer may be conformally formed on surfaces of the first and second interface patterns, the inner sidewalls of the inner spacers 350, inner sidewalls of the first gate spacer 272 and the second gate spacer structure 334 and an upper surface of the insulation layer 360, and a gate electrode layer may be formed to fill remaining portions of the third to sixth openings 372, 374, 382 and 384.

The gate insulation layer and the gate electrode layer may be formed by, e.g., a chemical vapor deposition (CVD) process, an ALD process, a physical vapor deposition (PVD) process, etc.

The gate electrode layer and the gate insulation layer may be planarized until the upper surface of the insulation layer 360 is exposed to form a first gate electrode 402 and a first gate insulation pattern 392 on the first region I of the substrate 100 and a second gate electrode 404 and a second gate insulation pattern 394 on the second region II of the substrate 100.

The first gate insulation pattern 392 and the first gate electrode 402 may form a first gate structure 412, and the second gate insulation pattern 394 and the second gate electrode 404 may form a second gate structure 414.

The semiconductor device may be manufactured by the above processes.

As illustrated above, the first well 130 in the first region I of the substrate 100 may be formed to include the first to third impurity regions 132, 134 and 136 sequentially stacked in the third direction D3, which may have different widths in the second direction D2.

That is, the first ion implantation mask 110 including the first opening 120 having the first width W1 may be formed on the substrate 100, and the first ion implantation process may be performed using the first ion implantation mask 110 to form the first and second impurity regions 132 and 134 having a relatively large width at the middle portion and the lower portion of the substrate 100. The first sacrificial spacer layer 140 may be formed on the opposite sidewalls and the bottom of the first opening 120 by an ALD process so that the width of the first opening 120 may be reduced to the second width W2. The second ion implantation process may be performed to form the third impurity region 136 having a relatively small width at the upper portion of the substrate 100.

Thus, the impurity regions may be formed in the first region I of the substrate 100 to have desired widths at different depths, which may be formed by using only one ion implantation mask. If the impurity regions are formed by using different ion implantation masks, the impurity regions may not have desired widths due to misalignment of the different ion implantation masks. However, in example embodiments, the misalignment may not occur, and thus the impurity regions may have the desired widths.

Additionally, the second well 170 in the second region II of the substrate 100 may be formed to include the sixth, fifth and fourth impurity regions 176, 174 and 172 sequentially stacked in the third direction D3, which may have different widths in the second direction D2.

That is, the second ion implantation mask 150 including the second opening 160 having the third width W3 may be formed on the substrate 100, and the third ion implantation process may be performed using the second ion implantation mask 150 to form the fourth impurity region 172 having a relatively large width at the upper portion of the substrate 100. The second sacrificial spacer layer 180 may be formed on the opposite sidewalls and the bottom of the second opening 160 by an ALD process so that the width of the second opening 160 may be reduced to the fourth width W4. The fourth ion implantation process may be performed to form the fifth and sixth impurity regions 174 and 176 having a relatively small width at the middle portion and the lower portion of the substrate 100.

Thus, the impurity regions may also be formed in the second region II of the substrate 100 to have desired widths at different depths, which may be formed by using only one ion implantation mask. If the impurity regions are formed by using different ion implantation masks, the impurity regions may not have desired widths due to misalignment of the different ion implantation masks. However, in example embodiments, the misalignment may not occur, and thus the impurity regions may have the desired widths.

In the method of manufacturing the semiconductor device in accordance with example embodiments, the impurity regions having desired width may be easily formed at desired depths of the substrate 100.

While example embodiments have been particularly shown and described, it will be understood by one of ordinary skill in the art that variations in form and detail may be made therein without departing from the spirit and scope of the claims.

What is claimed is:

1. A semiconductor device, comprising:
    first and second active patterns on a substrate including first and second regions, the first and second active patterns extending on the first and second regions, respectively, of the substrate in a first direction substantially parallel to an upper surface of the substrate;
    first and second gate structures on the first and second active patterns, respectively, the first and second gate structures extending in a second direction substantially parallel to the upper surface of the substrate and crossing the first direction; and
    first and second source/drain layers on portions of the first and second active patterns, respectively, adjacent to the first and second gate structures, respectively,
    wherein the first active pattern comprises a first well having first and second impurity regions stacked in a third direction substantially perpendicular to the first and second directions,
    wherein the second active pattern comprises a second well having third and fourth impurity regions stacked in the third direction,
    wherein a width in the second direction of the first impurity region is greater than a width in the second direction of the second impurity region, and
    wherein a width in the second direction of the third impurity region is smaller than a width in the second direction of the fourth impurity region.

2. The semiconductor device of claim 1, wherein the first impurity region is formed at a portion of the substrate under the first active pattern, and
    wherein a maximum width in the second direction of the first impurity region is greater than a width in the second direction of the first active pattern.

3. The semiconductor device of claim 1, wherein the width in the second direction of the second impurity region is smaller than a width in the second direction of the first active pattern.

4. The semiconductor device of claim 1, wherein the width in the second direction of the third impurity region is smaller than a width in the second direction of the second active pattern, and the width in the second direction of the fourth impurity region is substantially equal to the width in the second direction of the second active pattern.

5. The semiconductor device of claim 1, wherein an impurity concentration of the first impurity region is greater than an impurity concentration of the second impurity region, and an impurity concentration of the third impurity region is smaller than an impurity concentration of the fourth impurity region.

6. The semiconductor device of claim 1, wherein the first and second impurity regions comprise one or more n-type impurities, and the third and fourth impurity regions comprise one or more p-type impurities.

7. The semiconductor device of claim 6, wherein the first source/drain layer comprises silicon-germanium doped with one or more p-type impurities, and the second source/drain layer comprises silicon doped with one or more n-type impurities or silicon carbide doped with one or more n-type impurities.

8. The semiconductor device of claim 1, wherein the first well further comprises a fifth impurity region between the first and second impurity regions, and the second well further comprises a sixth impurity region between the third and fourth impurity regions,
    wherein a width in the second direction of the fifth impurity region is substantially equal to a width in the second direction of the first active pattern, and a width in the second direction of the sixth impurity region is smaller than a width in the second direction of the second active pattern.

9. The semiconductor device of claim 8, wherein an impurity concentration of the fifth impurity region is greater than an impurity concentration of the second impurity region, and an impurity concentration of the sixth impurity region is smaller than an impurity concentration of the fourth impurity region.

10. The semiconductor device of claim 1, further comprising:

first channels spaced apart from each other in the third direction, each of the first channels extending in the first direction through the first gate structure; and second channels spaced apart from each other in the third direction, each of the second channels extending in the first direction through the second gate structure.

11. The semiconductor device of claim 10, further comprising an inner spacer between the second source/drain layer and a portion of the second gate structure between the second channels.

12. A semiconductor device, comprising:

an active pattern on a substrate, the active pattern extending in a first direction substantially parallel to an upper surface of the substrate;

a gate structure on the active pattern, the gate structure extending in a second direction substantially parallel to the upper surface of the substrate and crossing the first direction;

channels spaced apart from each other in a third direction substantially perpendicular to the first and second directions, each of the channels extending in the first direction through the gate structure; and a source/drain layer on a portion of the active pattern adjacent to the gate structure, wherein the substrate and the active pattern comprise a well having first, second and third impurity regions stacked in the third direction, wherein a maximum width in the second direction of the first impurity region is greater than a width in the second direction of the active pattern, wherein a width in the second direction of the second impurity region is substantially equal to the width in the second direction of the active pattern, and wherein a width in the second direction of the third impurity region is smaller than the width in the second direction of the active pattern.

13. The semiconductor device of claim 12, wherein an impurity concentration of each of the first and second impurity regions is greater than an impurity concentration of the third impurity region.

14. The semiconductor device of claim 12, wherein each of the first to third impurity regions comprises one or more n-type impurities.

15. The semiconductor device of claim 14, wherein the source/drain layer comprises silicon-germanium doped with one or more p-type impurities.

16. A semiconductor device, comprising:

an active pattern on a substrate, the active pattern extending in a first direction substantially parallel to an upper surface of the substrate;

a gate structure on the active pattern, the gate structure extending in a second direction substantially parallel to the upper surface of the substrate and crossing the first direction;

channels spaced apart from each other in a third direction substantially perpendicular to the first and second direction, each of the channels extending in the first direction through the gate structure; and a source/drain layer on a portion of the active pattern adjacent to the gate structure, wherein the substrate and the active pattern comprise a well having first, second and third impurity regions stacked in the third direction, wherein a width in the second direction of each of the first and second impurity region is smaller than a width in the second direction of the active pattern, and wherein a width in the second direction of the third impurity region is substantially equal to the width in the second direction of the active pattern.

17. The semiconductor device of claim 16, wherein an impurity concentration of each of the first and second impurity regions is smaller than an impurity concentration of the third impurity region.

18. The semiconductor device of claim 16, wherein each of the first to third impurity regions comprises one or more p-type impurities.

19. The semiconductor device of claim 18, wherein the source/drain layer comprises silicon doped with one or more n-type impurities or silicon carbide doped with one or more n-type impurities.

20. The semiconductor device of claim 16, further comprising an inner spacer between the source/drain layer and a portion of the gate structure between the channels.

* * * * *